United States Patent
Friedrich et al.

(10) Patent No.: US 9,151,807 B2
(45) Date of Patent: *Oct. 6, 2015

(54) CIRCUITS AND METHODS FOR GENERATING A SELF-TEST OF A MAGNETIC FIELD SENSOR

(71) Applicant: Allegro MicroSystems, LLC, Worcester, MA (US)

(72) Inventors: Andreas P. Friedrich, Metz-Tessy (FR); Andrea Foletto, Annecy (FR); Michael C. Doogue, Bedford, NH (US); William P. Taylor, Amherst, NH (US); Ravi Vig, Bow, NH (US); P. Karl Scheller, Bow, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/321,347

(22) Filed: Jul. 1, 2014

(65) Prior Publication Data

US 2014/0312883 A1    Oct. 23, 2014

Related U.S. Application Data

(63) Continuation of application No. 13/743,451, filed on Jan. 17, 2013, now Pat. No. 8,818,749, which is a continuation of application No. 12/706,318, filed on Feb. 16, 2010, now Pat. No. 8,447,556.

(60) Provisional application No. 61/153,059, filed on Feb. 17, 2009.

(51) Int. Cl.
*G01R 27/28* (2006.01)
*G01R 33/00* (2006.01)
*G01R 35/00* (2006.01)

(52) U.S. Cl.
CPC ........ *G01R 33/0035* (2013.01); *G01R 33/0023* (2013.01); *G01R 35/005* (2013.01)

(58) Field of Classification Search
CPC ........... G01R 33/0023; G01R 33/0035; G01R 35/005
See application file for complete search history.

(56) References Cited

U.S. PATENT DOCUMENTS 4,236,832 A   12/1980   Komatsu et al.
4,438,347 A   3/1984   Gehring (Continued)

FOREIGN PATENT DOCUMENTS

CN   1501093 A   6/2004
CN   200986484 Y   12/2007

(Continued)

OTHER PUBLICATIONS

Letter to 21st Century Patent & Law Firm (with Amendment from related U.S. case) dated Nov. 18, 2014; for Korean Pat. App. No. 10-2010-701498; 20 pages.

(Continued)

*Primary Examiner* — Elias Desta
(74) *Attorney, Agent, or Firm* — Daly, Crowley, Mofford & Durkee, LLP

(57) ABSTRACT

A magnetic field sensor includes built in self-test circuits that allow a self-test of most of, or all of, the circuitry of the magnetic field sensor, including self-test of a magnetic field sensing element used within the magnetic field sensor, while the magnetic field sensor is functioning in normal operation.

24 Claims, 24 Drawing Sheets

(56) References Cited

U.S. PATENT DOCUMENTS

| | | |
|---|---|---|
| 4,752,733 A | 6/1988 | Petr et al. |
| 4,758,943 A | 7/1988 | Aström et al. |
| 4,760,285 A | 7/1988 | Nelson |
| 4,823,075 A | 4/1989 | Alley |
| 4,833,406 A | 5/1989 | Foster |
| 4,970,411 A | 11/1990 | Halg et al. |
| 5,247,278 A | 9/1993 | Pant et al. |
| 5,329,416 A | 7/1994 | Ushiyama et al. |
| 5,343,143 A | 8/1994 | Voisine et al. |
| 5,412,255 A | 5/1995 | Wallrafen |
| 5,424,558 A | 6/1995 | Borden et al. |
| 5,469,058 A | 11/1995 | Dunnam |
| 5,521,501 A | 5/1996 | Dettmann et al. |
| 5,621,319 A | 4/1997 | Bilotti et al. |
| 5,640,090 A | 6/1997 | Furuya et al. |
| 5,844,140 A | 12/1998 | Seale |
| 6,011,770 A | 1/2000 | Tan |
| 6,351,506 B1 | 2/2002 | Lewicki |
| 6,392,478 B1 | 5/2002 | Mulder et al. |
| 6,436,748 B1 | 8/2002 | Forbes et al. |
| 6,437,558 B2 | 8/2002 | Li et al. |
| 6,687,644 B1 | 2/2004 | Zinke et al. |
| 6,750,644 B1 | 6/2004 | Berkan |
| 6,853,178 B2 | 2/2005 | Hayat-Dawoodi |
| 6,896,407 B2 | 5/2005 | Nomiyama et al. |
| 6,917,321 B1 | 7/2005 | Haurie et al. |
| 7,038,448 B2 | 5/2006 | Schott et al. |
| 7,190,784 B2 | 3/2007 | Li |
| 7,259,545 B2 | 8/2007 | Stauth et al. |
| 7,292,095 B2 | 11/2007 | Burt et al. |
| 7,319,319 B2 | 1/2008 | Jones et al. |
| 7,323,870 B2 | 1/2008 | Tatschl et al. |
| 7,325,175 B2 | 1/2008 | Momtaz |
| 7,345,470 B2 | 3/2008 | Suzuki |
| 7,425,821 B2 | 9/2008 | Monreal et al. |
| 7,474,093 B2 | 1/2009 | Ausserlechner |
| 7,518,354 B2 | 4/2009 | Stauth et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,729,675 B2 | 6/2010 | Krone |
| 7,746,056 B2 | 6/2010 | Stauth et al. |
| 7,746,065 B2 | 6/2010 | Pastre et al. |
| 7,764,118 B2 | 7/2010 | Kusuda et al. |
| 7,769,110 B2 | 8/2010 | Momtaz |
| 7,800,389 B2 | 9/2010 | Friedrich et al. |
| 7,923,996 B2 | 4/2011 | Doogue et al. |
| 7,936,144 B2 | 5/2011 | Vig et al. |
| 7,961,823 B2 | 6/2011 | Kolze et al. |
| 7,990,209 B2 | 8/2011 | Romero |
| 8,030,918 B2 | 10/2011 | Doogue et al. |
| 8,128,549 B2 | 3/2012 | Testani et al. |
| 8,134,358 B2 | 3/2012 | Charlier et al. |
| 8,203,329 B2 | 6/2012 | Hohe et al. |
| 8,447,556 B2 | 5/2013 | Friedrich et al. |
| 8,680,846 B2 | 3/2014 | Cesaretti et al. |
| 8,818,749 B2 | 8/2014 | Friedrich et al. |
| 2002/0084923 A1 | 7/2002 | Li |
| 2003/0038675 A1 | 2/2003 | Gailus et al. |
| 2003/0102909 A1 | 6/2003 | Motz |
| 2006/0202692 A1 | 9/2006 | Tatschl et al. |
| 2006/0253746 A1 | 11/2006 | Momtaz |
| 2007/0110199 A1 | 5/2007 | Momtaz et al. |
| 2007/0247141 A1 | 10/2007 | Pastre et al. |
| 2007/0285089 A1 | 12/2007 | Ibuki et al. |
| 2008/0094055 A1 | 4/2008 | Monreal et al. |
| 2008/0110987 A1* | 5/2008 | Cato et al. ............... 235/437 |
| 2008/0137784 A1 | 6/2008 | Krone |
| 2008/0238410 A1 | 10/2008 | Charlier et al. |
| 2009/0001964 A1 | 1/2009 | Strzalkowski et al. |
| 2009/0001972 A1 | 1/2009 | Fernandez et al. |
| 2009/0085706 A1 | 4/2009 | Baarman et al. |
| 2009/0212765 A1 | 8/2009 | Doogue et al. |
| 2010/0211347 A1 | 8/2010 | Friedrich et al. |
| 2010/0321105 A1 | 12/2010 | Romero |
| 2011/0018533 A1 | 1/2011 | Cesaretti et al. |
| 2011/0048102 A1 | 3/2011 | Fernandez et al. |
| 2011/0074405 A1 | 3/2011 | Doogue et al. |
| 2011/0298448 A1 | 12/2011 | Foletto et al. |
| 2012/0274314 A1 | 11/2012 | Cesaretti et al. |
| 2012/0313635 A1 | 12/2012 | Daubert |
| 2013/0093412 A1 | 4/2013 | Anelli et al. |
| 2013/0214774 A1 | 8/2013 | Cesaretti et al. |

FOREIGN PATENT DOCUMENTS

| | | |
|---|---|---|
| DE | 195 39 458 A1 | 4/1997 |
| DE | 196 06 826 A1 | 8/1997 |
| DE | 10 2005 047 413 A1 | 9/2006 |
| DE | 10 2006 037 226 A1 | 2/2008 |
| DE | 10 2007 037 226 A1 | 2/2008 |
| DE | 10 2007 041 230 B3 | 4/2009 |
| EP | 0 289 414 A2 | 11/1988 |
| EP | 0 289 414 A3 | 11/1988 |
| EP | 0 338 122 | 10/1989 |
| EP | 0 357 013 A2 | 3/1990 |
| EP | 0 357 013 A3 | 3/1990 |
| EP | 0 944 888 B1 | 10/2001 |
| EP | 1 637 898 A1 | 3/2006 |
| EP | 1637898 A1 | 3/2006 |
| EP | 1 679 524 A1 | 7/2006 |
| EP | 1 850 143 A1 | 10/2007 |
| GB | 2 276 727 A | 10/1994 |
| JP | SHO 61-48777 | 3/1986 |
| JP | 03-248611 | 11/1991 |
| JP | H03-248611 A | 11/1991 |
| JP | 2000-55999 A | 2/2000 |
| JP | 2002-213992 A | 7/2002 |
| JP | 2004-177228 A | 6/2004 |
| JP | 2004-234589 A | 8/2004 |
| JP | 2006-123012 A | 5/2006 |
| JP | 2006-126012 A | 5/2006 |
| JP | 2008-513762 A | 5/2008 |
| JP | 2011-052306 A | 3/2011 |
| KR | 10-2007-0060096 A | 6/2007 |
| WO | WO 96/02849 A1 | 2/1996 |
| WO | WO 2004/072672 | 8/2004 |
| WO | WO 2006/035342 A1 | 4/2006 |
| WO | WO 2006/056829 A1 | 6/2006 |
| WO | WO 2007/138508 A1 | 12/2007 |
| WO | WO 2008/048379 A1 | 4/2008 |
| WO | WO 2009/108422 A2 | 9/2009 |
| WO | WO 2009/108422 A3 | 9/2009 |
| WO | WO 2010/096367 A1 | 8/2010 |
| WO | WO 2011/011479 | 1/2011 |

OTHER PUBLICATIONS

Korean Response to Notice of Reasons for Refusal dated Dec. 1, 2014; for Korean Pat. App. No. 10-2010-701498: 32 pages.

Office Action dated Nov. 24, 2014; for U.S. Appl. No. 13/398,127; 56 pages.

Letter to Taiwan International Patent & Law Offices dated Jul. 30, 2014; for Taiwan Pat. App. No. 102102201; 73 pages.

European Response to Search Report recieved May 23, 2014; for European Patent Application No. EP 12719134.4; 20 pages.

Response filed Jul. 30, 2014; of Office Action dated Jul. 3, 2014 for U.S. Appl. No. 13/398,127; 17 pages.

Office Action dated Jul. 3, 2014 for U.S. Appl. No. 13/398,127; filed Feb. 16, 2012; 73 pages.

Allegro MicroSystems, LLC; A3981 Automotive, Programmable Stepper Driver; datasheet; Jan. 2013; 43 pages.

Letter to Yuasa and Hara dated Jun. 19, 2014; for Japanese Pat. App. No. 2012-521746; 4 pages.

Letter from Yuasa and Hara dated Aug. 21, 2014; for Japanese Pat. App. No. 2012-521746; 1 page.

Japanese Argument filed on Jul. 3, 2014; for Japanese Pat. App. No. 2012-521746; 4 pages.

Taiwanese Marked-Up Specification filed on Aug. 28, 2014; for Taiwanese Pat. App. No. 102102201; 72 pages.

(56) References Cited

OTHER PUBLICATIONS

European Decision to Grant dated Aug. 14, 2014; for EP Pat. App. No. 13 169 661.9; 7 pages.
PCT International Preliminary Report on Patentability of the ISA dated Aug. 28, 2014, for PCT Pat. App. No. PCT/US2013/021143; 9 pages.
Korean Notice to Submit a Response dated Sep. 30, 2014; for Korean Pat. App. No. 10-2010-7019498; 5 pages.
European Notice of Allowance dated Aug. 29, 2014; for European Pat. App. No. 12 719 134.4; 7 pages.
Taiwan Notice of Allowance dated Sep. 26, 2014; for Taiwan Pat. App. No. 102102201; 2 pages.
U.S. Appl. No. 13/969,702, filed Aug. 19, 2013, Cesaretti et al.
Blagojevic et al.; "FD SOI Hall Sensor Electronics Interfaces for Energy Measurement," Microelectronics Journal 37; Sep. 2006; pp. 1576-1583.
Kayal et al.; "Automatic Calibration of Hall Sensor Microsystems;" Microelectronics Journal 37; Sep. 2006; pp. 1669-1575.
Office Action dated Jun. 12, 2013; for U.S. Appl. No. 13/743,451; 24 pages.
Response filed Oct. 8, 2013; to Office Action dated Jun. 12, 2013; for U.S. Appl. No. 13/743,451; 12 pages.
Notice of Allowance dated Dec. 24, 2013; U.S. Appl. No, 13/743,451; 24 pages.
312 Amendment filed Feb. 11, 2014; for U.S. Appl. No. 13/743,451; 7 pages.
Response to 312 Amendment received Mar. 21, 2014; for U.S. Appl. No. 13/743,451; 2 pages.
Response to Final Office Action; filed May 12, 2013; for U.S. Appl. No. 12/840,324; 19 pages.
Notice of Allowance dated May 24, 2013; for U.S. Appl. No. 12/840,324; 12 pages.
Corrected Notice of Allowance; dated Aug. 9, 2013; for U.S. Appl. No. 12/840,324; 6 pages.
Notice of Allowance dated Nov. 14, 2013; for U.S. Appl. No. 13/969,702; 26 pages.
Office Action dated Jun. 11, 2013; for U.S. Appl. No. 13/095,371; 31 pages.
Notice of Allowance dated Oct. 28, 2013; for U.S. Appl. No. 13/095,971; 19 pages.
Office Action dated Jul. 3, 2014 for U.S. Appl. No. 13/398,127, filed Feb. 16, 2012.
Chinese Office Action (English translation); dated Aug. 29, 2012; for Chinese Pat. App. No. 200980106535.4; 4 pages.
Letter from NTD Patent & Trademark Agency Limited; dated Oct. 10, 2012; for Chinese Pat. App. No. 200980106535.4; 13 pages.
Chinese Office Action (with English translation) dated Apr. 15, 2013; for CN Pat. App. No. 200980106535.4 4 pages.
Letter to NTD Patent and Trademark Agency; dated Jun. 19, 2013; for Chinese Pat. App. No. 200980106535.4; 11 pages.
Letter from NTD Patent and Trademark Agency; dated Jul. 11, 2013; for Chinese Pat. App. No. 200980106535.4; 1 page.
Chinese Office Action dated Nov. 7, 2013 (w/English translation); for Chinese Pat. App. No. 200980106535.4; 9 pages.
Claims from Chinese Office Action dated Nov. 7, 2013 (w/English translation); for Chinese Pat. App. No. 200980106535.4; 8 pages.
Letter to NTD Patent and Trademark Agency, Ltd. dated Dec. 16, 2013; for Chinese Pat. App. No. 200980106535.4; 10 pages.
Letter from NTD Patent and Trademark Agency, Ltd. dated Jan. 7, 2014; for Chinese Pat. App. No. 200980106535.4; 1 page.
Response to Office Action received Jan. 7, 2014; for Chinese Pat. App. No. 200980106535.4; 10 pages.
Japanese Notice of Reasons for Rejection (English translation); dated Apr. 4, 2013; for JP Pat. App. No. 2010-547666; 4 pages.
Letter from Yuasa & Hara; dated May 27, 2013; for JP Pat. App. No. 2010-547666; 2 pages.
Letter from Yuasa and Hara; dated Oct. 8, 2013; for Japanese Pat. App. No. 2010-547666; 2 pages.
Japanese Notice of Reasons for Rejection (English translation) dated Nov. 26, 2013; for JP Pat. App. No. 2010-547666; 2 pages.
Argument and Amendment (in Japanese); dated Jul. 3. 2013; for Japanese Pat. App. No. 2010-547666; 6 pages.
Claims for Argument and Amendment (in English); dated Jul. 3, 2013; for Japanese Pat. App. No. 2010-547666; 5 pages.
Japanese Amendment; dated Jun. 12, 2013; for Japanese Pat. App. No. 2012-521746; 5 pages.
Letter from Yuasa and Hera; dated Aug. 6, 2013; for Japanese Pat. App. No. 2012-521746; 6 pages.
German Office Action; dated Sep. 23, 2013; for German Pat. App. No. 11 2010 000 848.5; 12 pages.
Letter to Kuhnen & Wacker dated Jan. 20, 2014, with enclosures; for DE Pat. App. No. 112010000848.5; 14 pages.
Letter to Kuhnen and Wacker dated May 8, 2014; for German Pat. App. No. 112010000848.5; 2 pages.
Letter from Kuhnen and Wacker (including marked-up claims in English) dated May 26, 2014; for German Pat. App. No. 112010000848.5; 50 pages.
European Decision to Grant a European Patent; dated Sep. 5, 2013; for European Pat. App. No. 10739429.8; 2 pages.
European Search Report; dated Jul. 4, 2013; for EP Pat. App. No. 13169661.9; 11 pages.
PCT Search Report and Written Opinion; dated May 27, 2013; for PCT Pat. App. No. PCT/US2013/021143; 13 pages.
PCT International Preliminary Report on Patentability and Written Opinion of the ISA dated Nov. 7, 2013; for PCT Pat. App. No. PCT/US2012/032315; 13 pages.
Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.
Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458.
Ausserlechner; "Limits of Offset Cancellation by the Principle of Spinning Current Hall Probe;" Proceedings of IEEE Sensors; Oct. 2004; pp. 1117-1120.
Ausserlechner; "The piezo-Hall effect in n—silicon for arbitrary crystal orientation;" Proceedings of IEEE Sensors; vol. 3; Oct. 24, 2004; ISBN: 0-7803-8692-2; pp. 1149-1152.
Bahreyni, et al.; "A Resonant Micromachined Magnetic Field Sensor;" IEEE Sensors Journal; vol. 7, No. 9, Sep. 2007; pp. 1326-1334.
Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; pp. 141-152.
Baschirotto et al.; "Development and Analysis of PCB Vector 2-D Magnetic Field Sensor System for Electronic Compass;" IEEE Sensors Journal vol. 6, No. 2; Apr. 2006; pp. 365-371.
Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.
Demierre, et al.; "Reference Magnetic Actuator for Self-Calibration of a Very Small Hall Sensor Array;" Sensors and Actuators A97-98; Apr. 2002; pp. 39-46.
Frick, et al.; "CMOS Microsystem for AC Current Measurement with Galvanic Isolation;" IEEE Sensors Journal; vol. 3, No. 6; Dec. 2003; pp. 752-760.
Halg; "Piezo-Hall Coefficients of n-Type Silicon;" Journal of Applied Physics; vol. 64, No. 1; Jul. 1, 1988; pp. 276-282.
Hosticka; "CMOS Sensor Systems;" Sensors and Actuators A66; Apr. 1998; pp. 335-341.
Information Disclosure Statement Transmittal and IDS PTO/sb08; from U.S. Appl. No. 12/959,672; 2 pages.
Kanda et al.; "The Piezo-Hall Effect in n—Silicon;" 22$^{nd}$ International Conference on the Physics of Semiconductors; vol. 1, Jan. 1995; pp. 89-92.
Krammerer et al.; "A Hall effect sensors network insensitive to mechanical stress;" Proceedings of IEEE Sensors; vol. 3, Oct. 2004; pp. 1071-1074.
Mangnani et al.; "Mechanical Stress Measurement Electronics Based on Piezo-Resistive and Piezo-Hall Effects;" 9$^{th}$ International Conference on Electronics, Circuits and Systems 2002; vol. 1, SBN: 0-7803-7596-3; Dec. 2002; pp. 363-366.

(56) References Cited

OTHER PUBLICATIONS

Manic et al.; "Short and Long-Term Stability Problems of Hall Plates in Plastic Packages;" IEEE 38th Annual International Reliability Physics Symposium; Apr. 2000; pp. 225-230.
Manic; "Drift in Silicon Integrated Sensors and Circuits Due to the Thermo-Mechanical Stresses;" Lausanne, École Polytechnique Fédérale De Lausanne 2000; 176 pages.
Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; pp. 1151-1160.
Motz, et al.; "A Chopped Hall Sensor with Small Jitter and Programmable "True Power-On" Function;" IEEE Journal of Solid-State Circuits; vol. 40, No. 7; Jul. 2005; pp. 1533-1540.
Motz, et al.; "An Integrated Hall Sensor Platform Design for Position, Angle and Current Sensing;" IEEE Sensors 2006; Exco, Daegu, Korea / Oct. 22-25, 2006; pp. 1008-1011.
Munter; "A Low-offset Spinning-current Hall Plate;" Sensors and Actuators A21-A23; 1990; pp. 742-746.
Munter; "Electronic Circuitry for a Smart Spinning-current Hall Plate with Low Offset;" Sensors and Actuators A; Jun. 1991;.pp. 747-751.
Partin et al.; "Temperature Stable Hall Effect Sensors;" IEEE Sensors Journal, vol. 6, No. 1; Feb. 2006; pp. 106-110.
Pastre, et al.; "A Hall Sensor Analog Front End for Current Measurement with Continuous Gain Calibration;" IEEE Sensors Journal; vol. 7, No. 5; May 2007; pp. 860-867.
Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; pp. 95-98.
Popovic; "Sensor Microsystems;" Proc. 20th International Conference on Microelectronics (MWIL 95); vol. 2, NIS, Serbia, Sep. 12-14, 1995; pp. 531-537.
Randhawa; "Monolithic Integrated Hall Devices in Silicon Circuits;" Microelectronics Journal; vol. 12, No. 6; Sep. 14-17, 1981; pp. 24-29.
Ruther et al.; "Integrated CMOS-Based Sensor Array for Mechanical Stress Mapping;" 5th IEEE Conference on Sensors, Oct. 2007; pp. 1131-1134.
Ruther et al.; "Theromagnetic Residual Offset in Integrated Hall Plates;" IEEE Sensors Journal; vol. 3, No. 6; Dec. 2003; pp. 693-699.
Sargent; "Switched-capacitor IC controls feedback loop;" EDN; Design Ideas; Feb. 17, 2000; pp. 154 and 156.
Schneider, et al.; "Temperature Calibration of CMOS Magnetic Vector Probe for Contactless Angle Measurement System;" IEDM; Dec. 1996; pp. 533-536.
Schneider; "Temperature Calibration of CMOS Magnetic Vector Probe for Contactless Angle Measurement System," IEDM 1996 pp. 533-536.
Schott et al.; "Linearizing Integrated Hall Devices;" 1997 International Conference on Solid-State Sensors and Actuators, Jun. 16-19, 1997; pp. 393-396.
Schott, et al.; "CMOS Single-Chip Electronic Compass with Microcontroller;" IEEE Journal of Solid-State Circuits; vol. 42, No. 12; Dec. 2007; pp. 2923-2933.
Simon et al.; "Autocalibration of Silicon Hall Devices;" 8th International Conference on Solid-State Sensors and Actuators; vol. 2; Jun. 25, 1995; pp. 237-240.
Steiner et al; Offset Reduction in Hall Devices by Continuous Spinning Current Method; Sensors and Actuators A66; 1998; pp. 167-172.
Steiner: "Double-Hall Sensor with Self-Compensated Offset" Electron Devices Meeting; IDSM '97 Technical Digest; Dec. 7-10, 1997; pp. 911-914.
Stellrecht et al.; Characterization of Hygroscopic Swelling Behavior of Mold Compounds and Plastic Packages; IEEE Transactions on Components and Packaging Technoiogies; vol. 27, No. 3; Sep. 2004; pp. 499-506.
Tian at al.; "Multiple Sensors on Pulsed Eddy-Current Detection for 3-D Subsurface Crack Assessment;" IEEE Sensors Journal, vol. 5, No. 1; Feb. 2005; pp. 90-96.
Trontelj et al; "CMOS Integrated Magnetic Field Source Used as a Reference in Magnetic Field Sensors on Common Substrate;" WEP 1-6; IMTC; May 1994; pp. 461-463.
Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; pp. 322-324.
Zou et al.; "Three-Dimensional Die Surface Stress Measurements in Delaminated and Non-Delaminated Plastic Packages;" 48th Electronic Components and Technology Conference; May 25, 1998; pp. 1223-1234.
Office Acton dated Jul. 6, 2012; for U.S. Appl. No. 12/706,318; 29 pages.
Response filed Sep. 27, 2012; to Office Acton dated Jul. 6, 2012; for U.S. Appl. No. 12/706,318; 12 pages.
Notice of Allowance dated Dec. 10, 2013; Office Action dated Jul. 6, 2012; for U.S. Appl. No. 12/706,318; 9 pages.
Office Action dated Sep. 11, 2012 from U.S. Appl. No. 12/840,324, 30 pages.
U.S. Response filed Dec. 11, 2012; to Office Action dated Sep. 11, 2012; for U.S. Appl. No. 12/840,324; 15 pages.
Final Office Action dated Feb. 12, 2013; for U.S. Appl. No. 12/840,324; 19 pages.
European Notice of Allowance; dated Jan. 4, 2013; for European Pat. App. No. 10 739 429.8; 7 pages.
EP Official Communication; dated Feb. 23, 2012; for EP. Pat. App. No. 10739429.8; 2 pages.
Letter from NTD Patent and Trademark Agency Ltd.; dated Jan. 19, 2013; enclosing Response to Official Action; for Chinese Pat. App. No. 200980106535.4; 14 pages.
Office Action dated Aug. 29, 2012 from Chinese Application No. 200980106535.4, 8 pages.
Letter to NTD Patent and Trademark Agency Ltd.; dated Dec. 11, 2012; with instructions to file Response to Official Action; for Chinese Pat. App. No. 200980106535.4; 3 pages.
PCT Search Report and Written Opinion of the ISA for PCT/US2009/031776 dated Oct. 23, 2009.
PCT International Preliminary Report on Patentability and Written Opinion mailed Sep. 10, 2010 for PCT/US2009/031776.
PCT Search Report and Written Opinion of the ISA for PCT/US2010/024256 dated Aug. 11, 2010.
PCT International Preliminary Report on Patentability and Written Opinion of the ISA for PCT Pat. App. No. PCT/US2010/024256; dated Sep. 1, 2011; 9 pages.
PCT Search Report and Written Opinion of the ISA for PCT/US2010/042694 dated Sep. 27, 2010.
PCT International Preliminary Report on Patentability and Written Opinion of the ISA; dated Feb. 2, 2012; for PCT Pat. App. No. PCT/US2010/042694; 11 sheets.
PCT Search Report and Written Opinion of the ISA for PCT Pat. App. No. PCT/US2012/032315; dated Jun. 22, 2012; 16 pages.
U.S. Appl. No. 12/037,393, filed Feb. 26, 2008, 220 pages; Part 1 of 4.
U.S. Appl. No. 12/037,393, filed Feb. 26, 2008, 182 pages; Part 2 of 4.
U.S. Appl. No. 12/037,393, filed Feb. 26, 2008, 214 pages; Part 3 of 4.
U.S. Appl. No. 12/037,393, filed Feb. 26, 2008, 194 pages; Part 4 of 4.
U.S. Pat. No. 8,030,918; issued on Oct. 4, 2011; 534pages.
Cesaretti et al,; "Effect of Stress Due to Plastic Package Moisture Absorption in Hall Sensors," IEEE Transactions on Magnetics, vol. 45, No. 10; Oct. 2009; 4 pages.
European Response to Written Opinion dated Sep. 4, 2012; for PCT Pat. App. No. PCT/US2010/042694; 11 pages.
U.S. Pat. No. 8,447,556; 250 pages; part 1 of 20.
U.S. Pat. No. 8,447,556; 250 pages; part 2 of 20.
U.S. Pat. No. 8,447,556; 250 pages; part 3 of 20.
U.S. Pat. No. 8,447,556; 250 pages; part 4 of 20.
U.S. Pat. No. 8,447,556; 250 pages; part 5 of 20.

(56) References Cited

OTHER PUBLICATIONS

U.S. Pat. No. 8,447,556; 250 pages; part 6 of 20.
U.S. Pat. No. 8,447,556; 250 pages; part 7 of 20.
U.S. Pat. No. 8,447,556; 250 pages; part 8 of 20.
U.S. Pat. No. 8,447,556; 250 pages; part 9 of 20.
U.S. Pat. No. 8,447,556; 250 pages; part 10 of 20.
U.S. Pat. No. 8,447,556; 250 pages; part 11 of 20.
U.S. Pat. No. 8,447,556; 250 pages; part 12 of 20.
U.S. Pat. No. 8,447,556; 250 pages; part 13 of 20.
U.S. Pat. No. 8,447,556; 250 pages; part 14 of 20.
U.S. Pat. No. 8,447,556; 250 pages; part 15 of 20.
U.S. Pat. No. 8,447,556; 250 pages; part 16 of 20.
U.S. Pat. No. 8,447,556; 250 pages; part 17 of 20.
U.S. Pat. No. 8,447,556; 250 pages; part 18 of 20.
U.S. Pat. No. 8,447,556; 250 pages; part 19 of 20.
U.S. Pat. No. 8,447,556; 221 pages; part 20 of 20.
U.S. Pat. No. 8,818,749; 250 pages; part 1 of 5.
U.S. Pat. No. 8,818,749; 250 pages; part 2 of 5.
U.S. Pat. No. 8,818,749; 250 pages; part 3 of 5.
U.S. Pat. No. 8,818,749; 250 pages; part 4 of 5.
U.S. Pat. No. 8,818,749; 144 pages; part 5 of 5.
Japanese Notice of Reasons for Rejection dated Sep. 29, 2014; for Japanese Pat. App. No. 2010-547666; 4 pages.
Korean Notice to Submit a Response (with English translation) dated Sep. 30, 2014; for Korean Pat. App. No. 10-2010-7019498; 10 pages.
Letter to Yuasa and Hara dated Aug. 12, 2014; for Japanese application corresponding to PCT Pat. App. PCT/US2013/021143; 2 pages.
Letter from Yuasa and Hara dated Nov. 14, 2014; for Japanese application corresponding to PCT Pat. App. PCT/US2013/021143; 1 pages.
Japanese Claims as filed (English translation) received Nov. 14, 2014; for Japanese application corresponding to PCT Pat. App. PCT/US2013/021143; 8 pages.
European Decision to Grant a European Patent dated Apr. 23, 2015; for European Pat. App. No. 12719134.4; 2 pages.
U.S. Appl. No. 14/255,166, filed Apr. 17, 2014, Cessaretti et al.
U.S. Appl. No. 14/264,522, filed Apr. 29, 2014, McIntosh et al.
European Decision to Grant dated Dec. 18, 2014; for European Pat. App. No. 13169661.9; 2 pages.
Letter to Yuasa and Hara dated Dec. 5. 2014; for Japanese Pat. App. No. 2014-508370; 2 pages.
Japanese Claims (English translation) as filed with Request for Examination on Dec. 11, 2014; for Japanese Pat. App. No. 2014-508370; 5 pages.
Letter to Yuasa and Hara dated Jan. 9, 2015; for Japanese Pat. App. No. 2010-547666; 6 pages.
Claims filed Jan. 27, 2015 in Response to Japanese Office Action; for Japanese Pat. App. No. 2010-547666; 5 pages.
Response filed Mar. 2, 2015; to Office Action dated Oct. 30, 2014; for U.S. Appl. No. 13/177,075; 16 pages.
Korean Notice to Submit a Response dated Jan. 30, 2015; for Korean Pat. App. No. 5-2002-043492-2; 6 pages.
Letter to $21^{st}$ Century Patent & Law Firm dated Mar. 10, 2015; for Korean Pat. App. No. 10-2014-7033792; 2 pages.
Response filed Mar. 18, 2015; for Office Action dated Nov. 24, 2014; 28 pages.
European Response filed Mar. 20, 2015; for European Pat. App. No. 13703914.5; 34 pages.
Letter from $21^{st}$ Century Patent & Law Firm dated Mar. 23, 2015; for Korean Pat. App. No. 10-2014-7033792; 1 page.
Korean Response to Notice of Reasons for Refusal dated Mar. 23, 2015; for Korean Pat. App. No. 10-2014-7033792; 11 page.
Japanese Allowed Claimes received May 25, 2015; for Japanese Pat. App. No. 2010-547666; 5 pages.
Korean Notice of Allowance with Allowed Claims (English Translation); dated Apr. 20, 2015; for Korean Pat. App. No. 10-2010-7019498; 12 pages.
Notice of Allowance dated Jul. 28, 2015; for U.S. Appl. No. 13/398,127; 22 pages.
Korean Notice of Allowance dated Jul. 31, 2015; for Korean Pat. App. No. 10-2014-7033792; 5 pages.
PCT Search Report and Written Opinion of the ISA dated Aug. 4, 2015; for PCT Pat. App. No. PCT/US2015/026071; 16 pages.

* cited by examiner

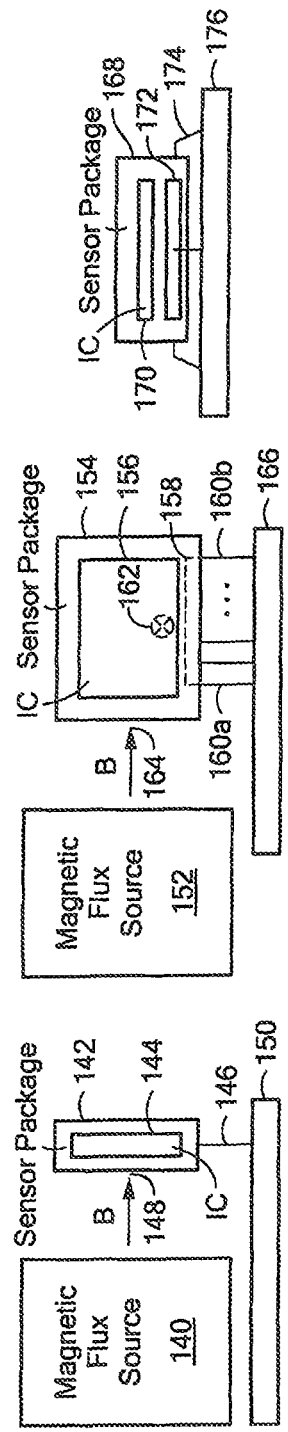

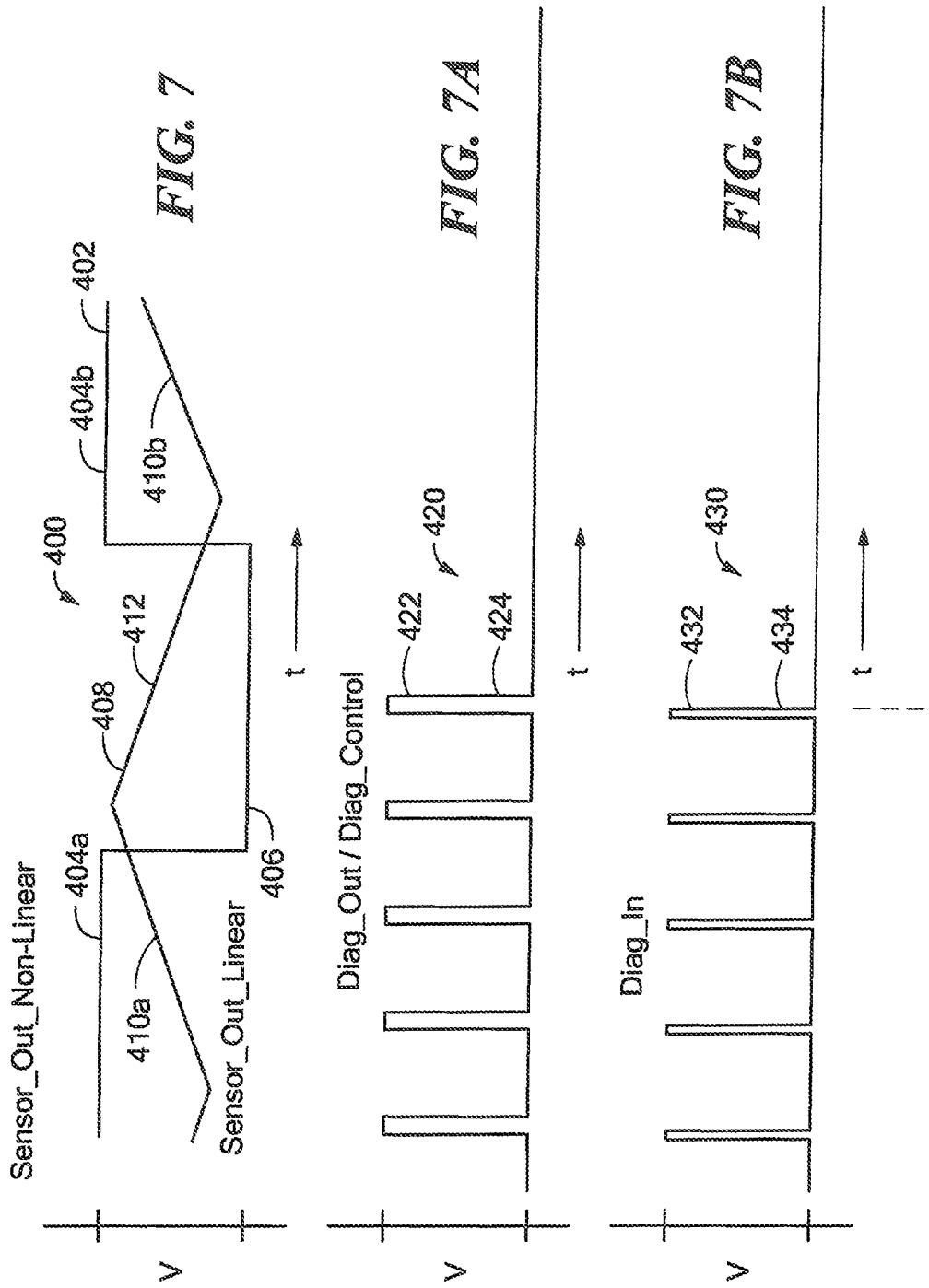

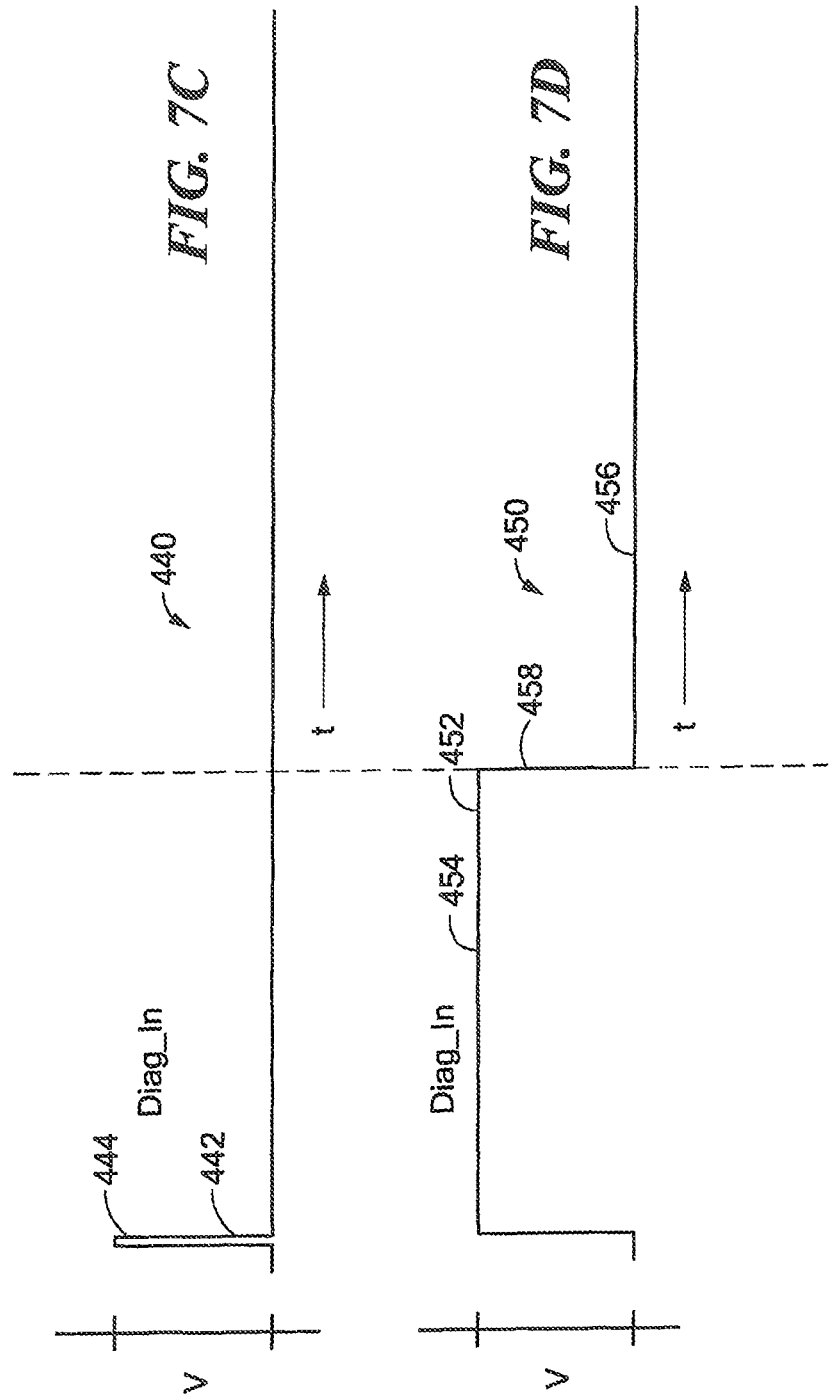

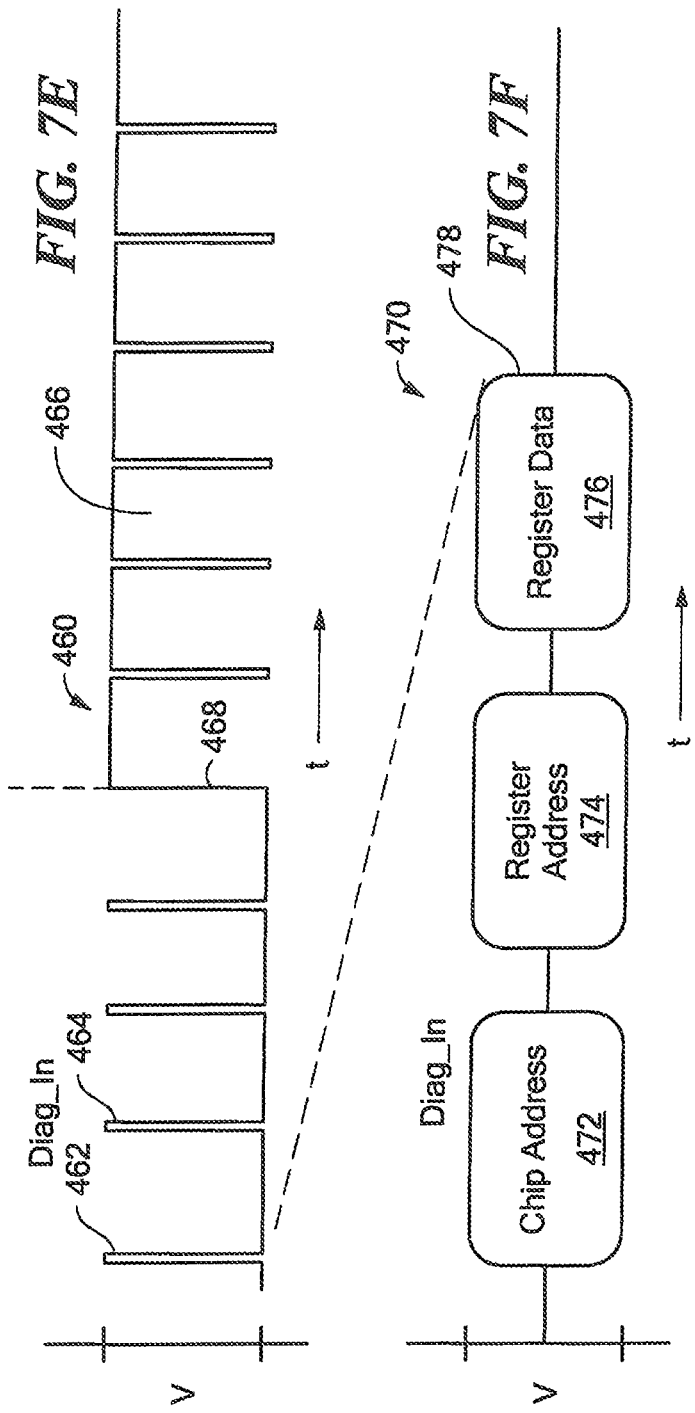

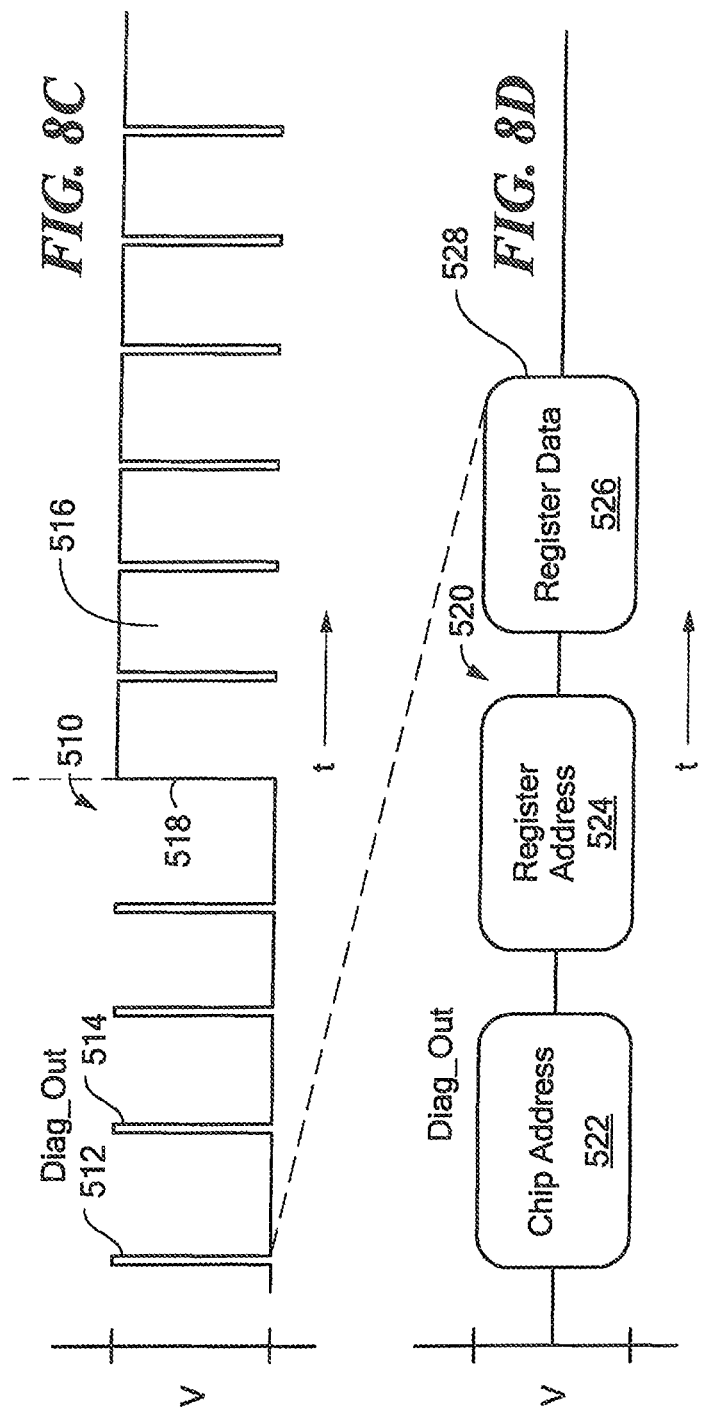

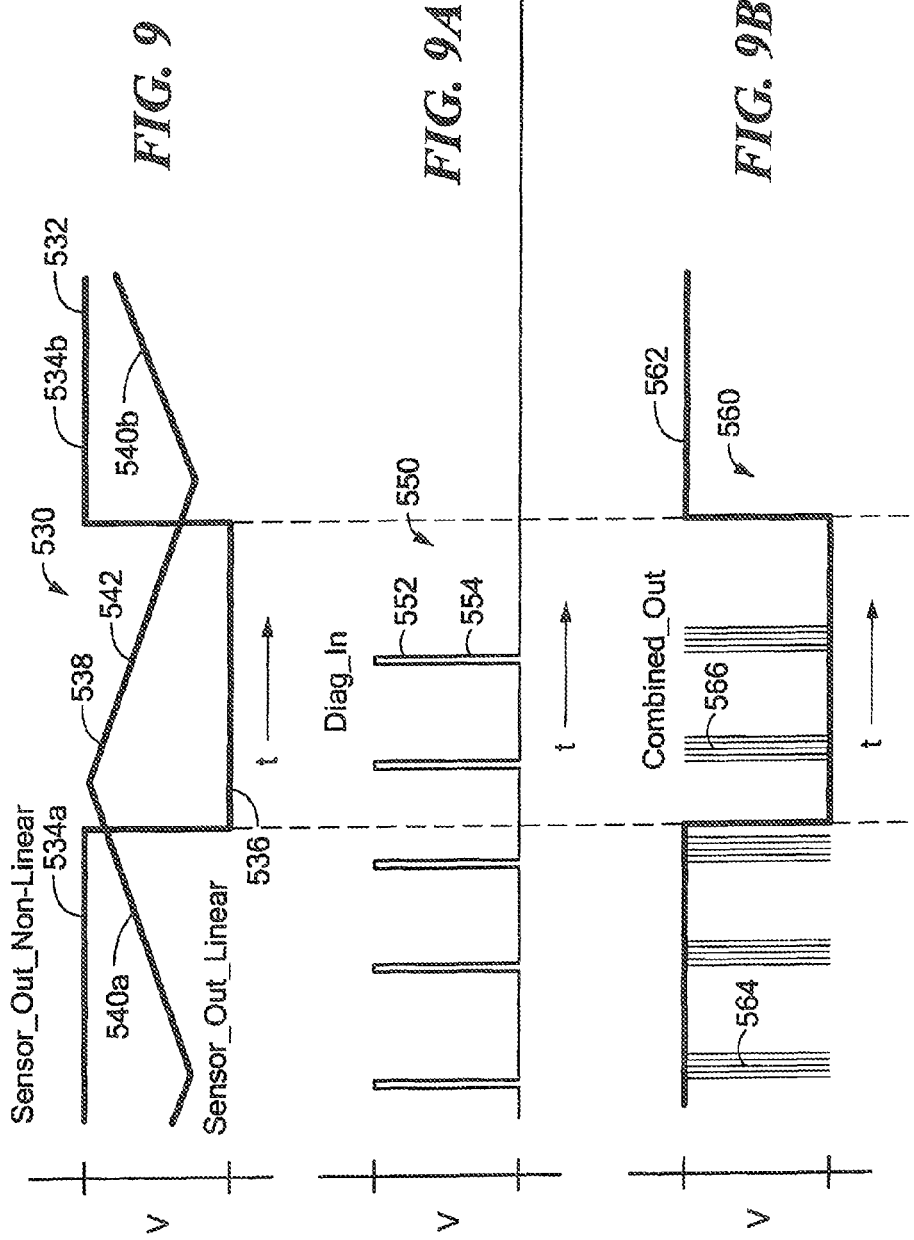

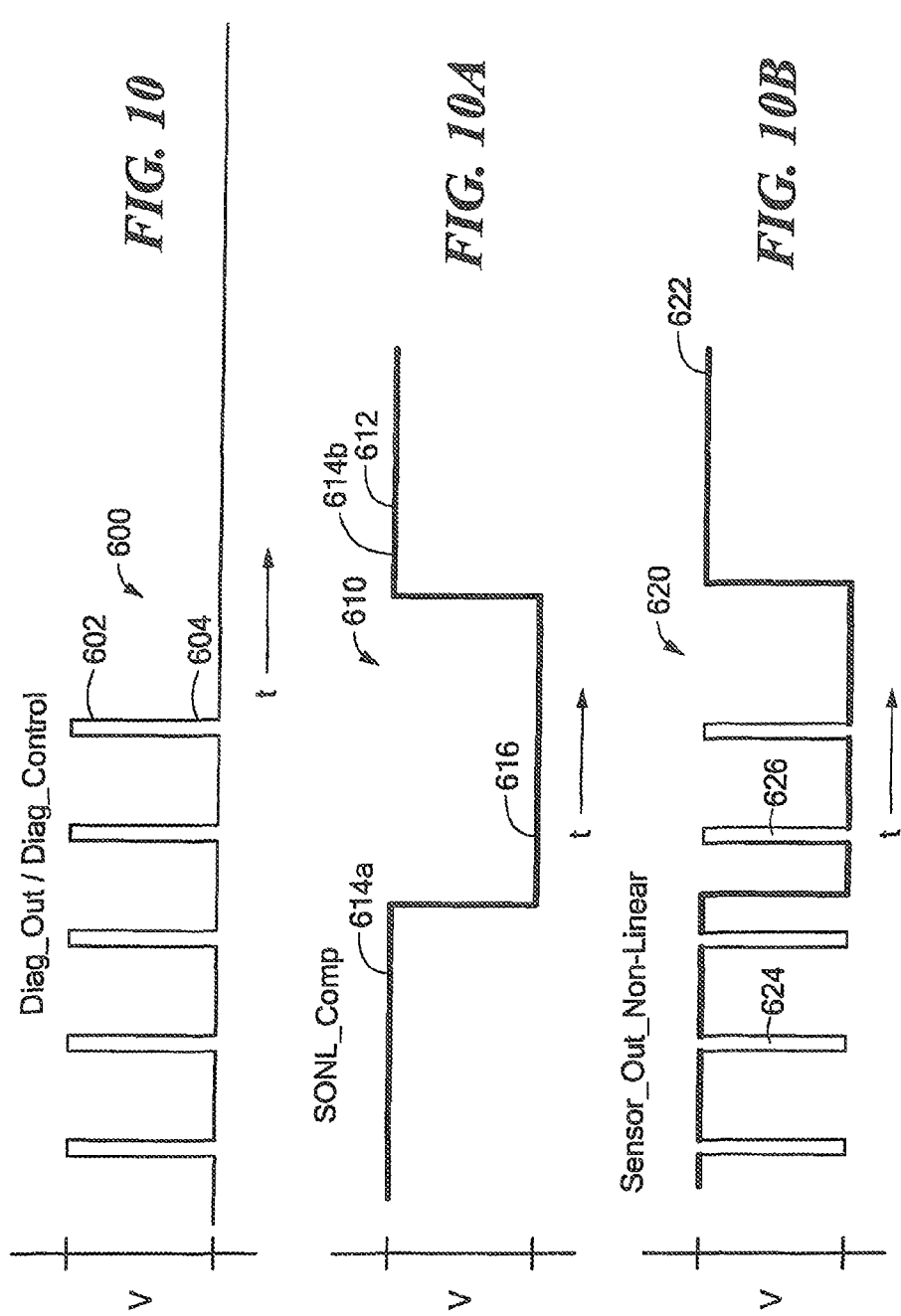

CIRCUITS AND METHODS FOR GENERATING A SELF-TEST OF A MAGNETIC FIELD SENSOR

CROSS REFERENCE TO RELATED APPLICATIONS

This application is a Continuation Application of U.S. patent application Ser. No. 13/743,451, filed Jan. 17, 2013, now U.S. Pat. No. 8,818,749, issued Aug. 26, 2014, which application is a Continuation Application of U.S. patent application Ser. No. 12/706,318, filed Feb. 16, 2010, now U.S. Pat. No. 8,447,556, issued May 21, 2013, which application claims the benefit under 35 U.S.C. §119(e) of U.S. Provisional Application No. 61/153,059 filed Feb. 17, 2009, which applications are incorporated herein by reference in their entirety.

STATEMENT REGARDING FEDERALLY SPONSORED RESEARCH

Not Applicable.

FIELD OF THE INVENTION

This invention relates generally to magnetic field sensors and, more particularly, to a magnetic field sensors having a self-test capability.

BACKGROUND OF THE INVENTION

As is known, there are a variety of types of magnetic field sensing elements, including, but not limited to, Hall effect elements, magnetoresistance elements, and magnetotransistors. As is also known, there are different types of Hall effect elements, for example, a planar Hall element, a vertical Hall element, and a circular Hall element. As is also known, there are different types of magnetoresistance elements, for example, a giant magnetoresistance (GMR) element, an anisotropic magnetoresistance element (AMR), a tunneling magnetoresistance (TMR) element, and a magnetic tunnel junction (MTJ).

Hall effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetic field sensors, i.e., circuits that use magnetic field sensing elements, are used in a variety of applications, including, but not limited to, a current sensor that senses a magnetic field generated by a current carried by a current-carrying conductor, a magnetic switch that senses the proximity of a ferromagnetic object, a rotation detector that senses passing ferromagnetic articles, for example magnetic domains of a ring magnet, and a magnetic field sensor that senses a magnetic field density of a magnetic field.

As is known, some integrated circuits have internal built-in self-test (BIST) capabilities. A built-in self-test is a function that can verify all or a portion of the internal functionality of an integrated circuit. Some types of integrated circuits have built-in self-test circuits built directly onto the integrated circuit die. Typically, the built-in self-test is activated by external means, for example, a signal communicated from outside the integrated circuit to dedicated pins or ports on the integrated circuit. For example, an integrated circuit that has a memory portion can include a built-in self-test circuit, which can be activated by a self-test signal communicated from outside the integrated circuit. The built-in self-test circuit can test the memory portion of the integrated circuit in response to the self-test signal.

Conventional built-in self-test circuits tend not to allow the integrated circuit to perform its intended function while the built-in self-test is being performed. Instead, during the built-in self-test, the built-in self-test circuit exercises all of, or parts of, circuits on the integrated circuit in particular ways that do not necessarily allow concurrent operation of functions that the integrated circuit is intended to perform. Therefore, the built-in self-test is typically only activated one time, for example, upon power up of the integrated circuit, or from time to time. At other times, the built-in self-test circuit and function are dormant and the integrated circuit can perform its intended function.

Furthermore, when used in magnetic field sensors, conventional built-in self-test circuits tend not to test the magnetic field sensing element used in the magnetic field sensor.

It would be desireable to provide built in self-test circuits and techniques in a magnetic field sensor that allow the self-test to be run from time to time or upon command while the magnetic field sensor concurrently performs its intended function. It would also be desirable to provide such a concurrent self-test that tests a magnetic field sensing element used within the magnetic field sensor.

SUMMARY OF THE INVENTION

The present invention provides self-test circuits and techniques in a magnetic field sensor that allow the self-test to be run from time to time or upon command while the magnetic field sensor concurrently performs its intended function. The present invention also provides such a concurrent self-test that tests a magnetic field sensing element used within the magnetic field sensor.

In accordance with one aspect of the present invention, a magnetic field sensor includes a magnetic field sensing element supported by a substrate. The magnetic field sensing element is for generating a composite magnetic field signal having a measured-magnetic-field-responsive signal portion and a self-test-responsive signal portion. The measured-magnetic-field-responsive signal portion is responsive to a measured magnetic field. The self-test-responsive signal portion is responsive to a self-test magnetic field. The magnetic field sensor also includes a self-test circuit having a self-test current conductor proximate to the magnetic field sensing element. The self-test current conductor is for carrying a self-test current to generate the self-test magnetic field. The magnetic field sensor also includes a processing circuit coupled to receive a signal representative of the composite magnetic field signal. The processing circuit is configured to generate a sensor signal representative of the measured-magnetic-field-responsive signal portion. The processing circuit is also configured to generate at least one of a diagnostic signal representative of the self-test-responsive signal portion or a composite signal representative of both the measured-magnetic-field-responsive signal portion and the self-test-responsive signal portion.

In accordance with another aspect of the present invention, a method of generating a self-test of a magnetic field sensor includes generating, with a magnetic field sensing element, a composite magnetic field signal comprising a measured-magnetic-field-responsive signal portion and a self-test-responsive signal portion. The measured-magnetic-field-responsive signal portion is responsive to a measured magnetic field. The self-test-responsive signal portion is responsive to a self-test magnetic field. The method also includes generating a self-test current in a self-test current conductor proximate to the magnetic field sensing element. The self-test current conductor is for carrying the self-test current to generate the self-test magnetic field. The method also includes generating a sensor output signal representative of the measured-magnetic-field-responsive signal portion. The method also includes generating at least one of a diagnostic signal representative of the self-test-responsive signal portion or a composite signal representative of both the measured-magnetic-field-responsive signal portion and the self-test-responsive signal portion.

BRIEF DESCRIPTION OF THE DRAWINGS

The foregoing features of the invention, as well as the invention itself may be more fully understood from the following detailed description of the drawings, in which:

FIGS. 3E-3G are block diagrams showing three arrangements for magnetic field sensors;

FIG. 7 is a graph showing exemplary output signals from the magnetic field sensors of FIGS. 1, 5, 5A, and 6;

FIG. 7A is a graph showing another exemplary output signal from the magnetic field sensors of FIGS. 1, 5, 5A, and 6;

FIGS. 7B-7F are graphs showing different exemplary diagnostic input signals received by the diagnostic request processor of the magnetic field sensors of FIGS. 1, 5, 5A, and 6;

FIGS. 8A-8D are graphs showing different exemplary diagnostic output signals generated by the magnetic field sensors of FIGS. 1, 5, 5A, and 6;

FIG. 9 is a graph showing exemplary output signals, the same as or similar to the output signals shown in FIG. 7, from the magnetic field sensors of FIGS. 1, 5, 5A, and 6;

FIG. 9A is a graph showing a diagnostic input signal, the same as or similar to the diagnostic input signal of FIGS. 7B and 8, received by the diagnostic request processor of the magnetic field sensors of FIGS. 1, 5, 5A, and 6;

FIGS. 9B-9E are graphs showing different exemplary combined output signals generated by the magnetic field sensors of FIGS. 1, 5, 5A, and 6;

FIGS. 10-10B are a series of graph showing a diagnostic control signal, a diagnostic output signal generated by the magnetic field sensors of FIGS. 5 and 6, and a diagnostic output signal generated by the magnetic field sensor of FIG. 5A;

DETAILED DESCRIPTION OF THE INVENTION

Before describing the present invention, some introductory concepts and terminology are explained. As used herein, the term "magnetic field sensing element" is used to describe a variety of electronic elements that can sense a magnetic field. The magnetic field sensing elements can be, but are not limited to, Hall effect elements, magnetoresistance elements, or magnetotransistors. As is known, there are different types of Hall effect elements, for example, a planar Hall element, a vertical Hall element, and a circular Hall element. As is also known, there are different types of magnetoresistance elements, for example, a giant magnetoresistance (GMR) element, an anisotropic magnetoresistance element (AMR), a tunneling magnetoresistance (TMR) element, an Indium antimonide (InSb) sensor, and a magnetic tunnel junction (MTJ).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, most types of magnetoresistance elements tend to have axes of maximum sensitivity parallel to the substrate and most types of Hall elements tend to have axes of sensitivity perpendicular to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

Figure 1:
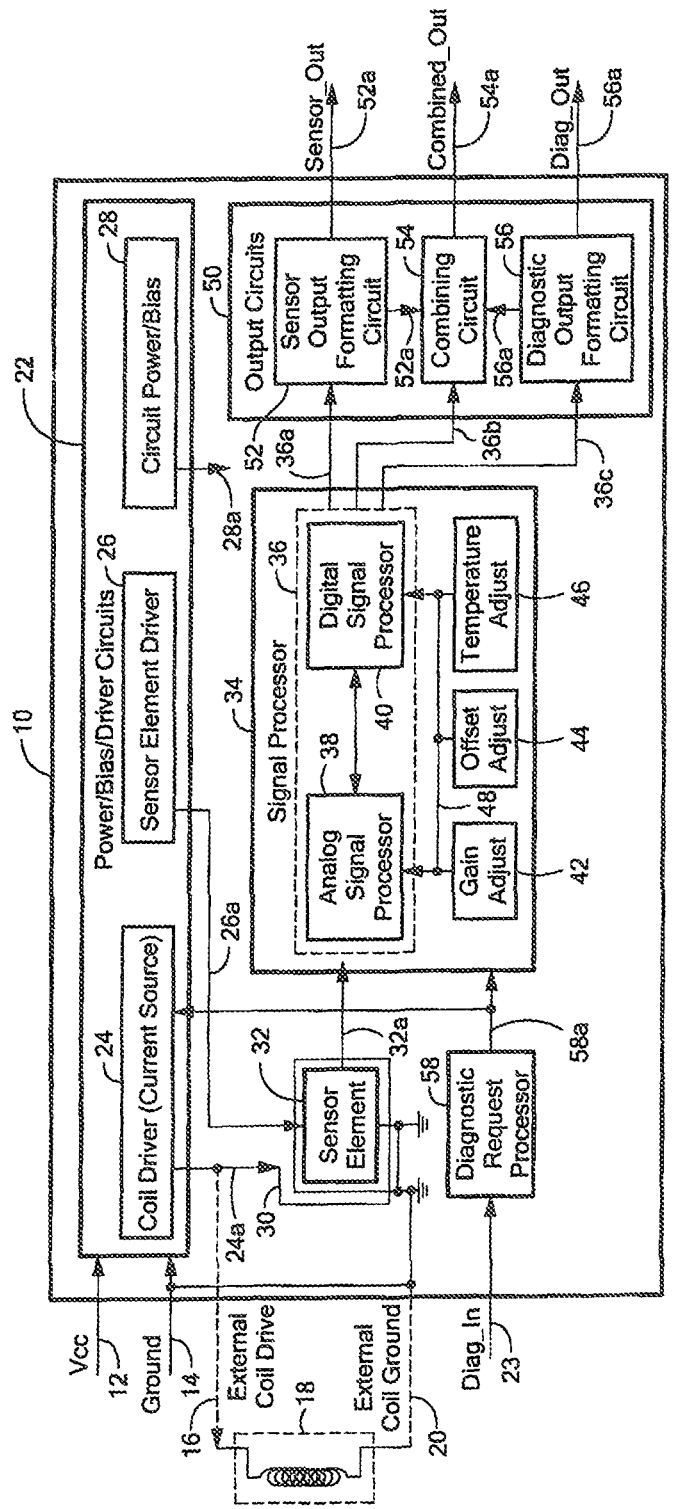
FIG. 1 is block diagram showing a magnetic field sensor in accordance with the present invention, having a magnetic field sensing element, a self-test conductor, a diagnostic request processor, a signal processor, and output circuits.

Referring to FIG. 1, a magnetic field sensor 10 includes a magnetic field sensing element 32 supported by a substrate (not shown). The magnetic field sensing element 32 is for generating a composite magnetic field signal 32a having a measured-magnetic-field-responsive signal portion and a self-test-responsive signal portion. The measured-magnetic-field-responsive signal portion is responsive to a measured magnetic field. The self-test-responsive signal portion is responsive to a self-test magnetic field. The magnetic field sensor 10 also includes a self-test circuit having a self-test current conductor 30 proximate to the magnetic field sensing element 32. The self-test current conductor 30 is for carrying a self-test current 24a to generate the self-test magnetic field. The magnetic field sensor 10 also includes a processing circuit 34 coupled to receive a signal, e.g., the signal 32a, representative of the composite magnetic field signal 32a. The processing circuit 34 is configured to generate a sensor signal 36a representative of the magnetic field-signal portion. The processing circuit 34 is also configured to generate at least one of a diagnostic signal 36c representative of the self-test-responsive signal portion or a composite signal 36b representative of both the measured-magnetic-field-responsive signal portion and the self-test-responsive signal portion.

In some embodiments, the self-test magnetic field is within a range of about twenty to forty Gauss. However in other embodiments, the self-test magnetic field can be smaller than twenty Gauss or greater than forty Gauss.

The magnetic field sensor 10 can include power and bias and driver circuits 22. The power and bias and driver circuits 22 can include a circuit power and bias module 28 configured to provide various voltages and currents to the rest of the circuitry within the magnetic field sensor 10. The power and bias and driver circuits 22 can also include a sensor element driver module 26 (e.g., a current source) configured, for example, to generate a current signal 26a coupled to the magnetic field sensing element 32. The power and bias and driver circuits 22 can also include a coil driver module 24 (e.g., a current source) configured to generate a current signal 24a coupled to the self-test current conductor 30. However, in other embodiments, an external coil driver module, apart from the integrated circuit 10 can be used.

The magnetic field sensor 10 can also include a diagnostic request processor 58 coupled to receive a diagnostic input signal (Diag_In) 23. The diagnostic request processor 58 is described more fully below in conjunction with FIG. 4 and the diagnostic input signal 23 is described more fully below in conjunction with FIGS. 4 and 7B-7F. However, let is suffice here to say that, in some embodiments, the diagnostic input signal 23 can be decoded by the diagnostic request processor 58, and, in response to the diagnostic input signal 23, the diagnostic request processor 58 can initiate a self-test of the magnetic field sensor 10. The diagnostic request processor 58 can generate a diagnostic control signal 58a, and the coil driver module 24 can be coupled to receive the diagnostic control signal 58a. In response to the diagnostic control signal 58a, the coil driver circuit 24 can generate the current signal 24a.

The processing circuit 34 (also referred to herein as a signal processor 34) can include a processing module 36 having either an analog signal processor 38, a digital signal processor 40, or any combination of analog and digital processors 38, 40 that perform any combination of analog and digital processing of the composite magnetic field signal 32a. The arrow shown between the analog signal processor 38 and the digital signal processor 40 is used merely to indicate the combination of analog and digital signal processing and various couplings therebetween.

The signal processor 34 can also include a gain adjustment module 42, an offset adjustment module 44, and a temperature adjustment module 46, each coupled to the processing module 36. The gain adjustment module 42 is configured to contribute to a signal 48 received by the processing module 36, which signal 48 is configured to adjust or calibrate a gain of the processing module 36. The offset adjustment module 44 is also configured to contribute to the signal 48 received by the processing module 36, which signal 48 is also configured to adjust or calibrate a DC offset of the processing module 36. The temperature adjustment module 46 is also configured to contribute to the signal 48 received by the processing module 36, which signal 48 is configured to adjust or calibrate a gain and/or a DC offset of the processing module 36 over temperature excursions. It will be understood that that gain, offset, and temperature are but some common parameters that are compensated/adjusted, but that compensation/adjustment is not limited to those parameters only.

The processing module 36 is configured to generate the sensor signal 36a representative of the above-described measured-magnetic-field-responsive signal portion. The processing module 36 is also configured to generate at least one of the diagnostic signal 36c representative of the above-described self-test-responsive signal portion or the composite signal 36b representative of both the measured-magnetic-field-responsive signal portion and the self-test-responsive signal portion.

In some embodiments, the magnetic field sensor 10 can also include output circuits 50, for example, a sensor output formatting circuit 52, a diagnostic output formatting circuit 56, and a combining circuit 54. Operation of the sensor output formatting circuit 52, the diagnostic output formatting circuit 56, and the combining circuit 54 will be further understood from discussion below in conjunction with FIGS. 8-8D and 9-9E. Let it suffice here to say that the sensor output formatting circuit 52 can reformat the signal 36a representative of the measured-magnetic-field-responsive signal portion to generate a sensor output signal 52a (Sensor_Out). The diagnostic signal formatting circuit 56 can reformat the signal 36c representative of the self-test-responsive signal portion to generate a diagnostic output signal 56a (Diag_Out). The combining circuit 54 can either reformat the signal 36b representative of both the measured-magnetic-field-responsive signal portion and the self-test-responsive signal portion to generate a combined output signal 54a (Combined_Out), or it can use the signals 52a, 56a to accomplish a similar result.

The magnetic field sensor 10 can also provide an external coil drive signal 16 and an external ground 20, which can be coupled to an external conductor or coil 18. The coil 18 can be used in place of the self-test current conductor 30 to generate the above-described self-test magnetic field.

In operation, the current signal 24a can be a pulse signal, and therefore, the self-test magnetic field can be a pulsed magnetic field generated by the self-test current conductor 30 or by the external coil 18. The self-test magnetic field can physically combine with the above-described measured magnetic field, which is a field associated with that which the magnetic field sensor 10 is intended to measure. For example, the magnetic field sensor 10 can be intended to measure a magnetic field associated with a ferromagnetic or magnetic object, which generates the measured magnetic field. For another example, the magnetic field sensor 10 can be intended to measure a current flowing in a conductor (not shown), which generates the measured magnetic field.

In operation, the combination of the measured magnetic field and the self-test magnetic field is received by the magnetic field sensing element 32. The self-test magnetic field can be initiated by way of the diagnostic input signal 23, described more fully below in conjunction with FIGS. 7-7F. The self-test magnetic field can also be initiated in other ways described more fully below in conjunction with FIG. 4. The magnetic field sensing element thus generates the above described composite magnetic field signal 32a having a measured-magnetic-field-responsive signal portion, which is responsive to the measured magnetic field, and a self-test-responsive signal portion, which is responsive to the self-test magnetic field.

In some embodiments, the processing circuit 36 can operate to separate the measured-magnetic-field-responsive signal portion from the self-test-responsive signal portion to generate the sensor signal 36a representative of the magnetic field-signal portion and the diagnostic signal 36c representative of the self-test-responsive signal portion. However, in some embodiments, the processing circuit can generate the composite signal 36b representative of both the measured-magnetic-field-responsive signal portion and the self-test-responsive signal portion in addition to or in place of the signal 36c.

In operation the output circuits 50 can reformat the signals 36a-36c into at least the formats described below in conjunction with FIGS. 8A-8D, 9, 9B-9E, 10A, and 10B.

Figure 2:
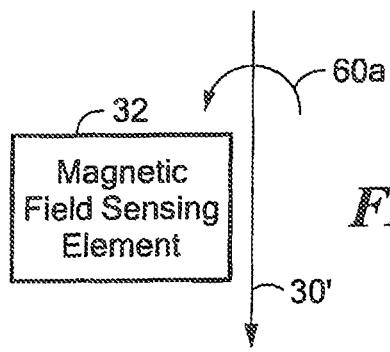
FIG. 2 is a block diagram showing one exemplary arrangement of the magnetic field sensing element and the self-test conductor of FIG. 1.

Referring now to FIG. 2, in which like elements of FIG. 1 are shown having like reference designations, a self-test current conductor 30' (where the prime symbol is indicative of one particular variation of the self-test current conductor 30 of FIG. 1) is proximate to the magnetic field sensing element 32. When a current in the direction of the arrow on the conductor 30' passes through the self-test current conductor 30', a self-test magnetic field 60a is generated and is received by the magnetic field sensing element 32 as a magnetic field generally perpendicular to a major surface of the magnetic field sensing element 32. Thus, this arrangement is generally suitable for most types of Hall effect elements.

The self-test magnetic field 60a can be a pulsed magnetic field generated by a pulsed current carried by the self-test current conductor 30'. The self-test magnetic field 60a physically adds to any other magnetic field (not shown), e.g., the measured magnetic field, experienced by the magnetic field sensing element 32.

Figure 2A:
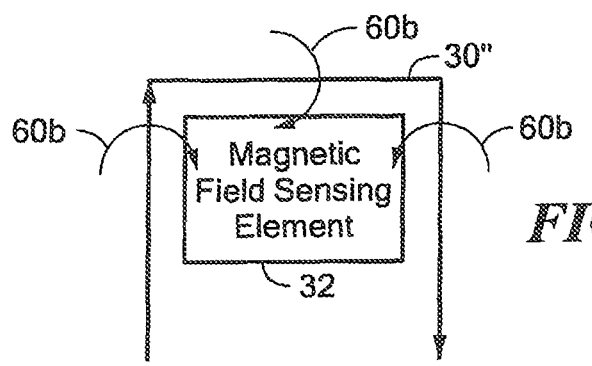
FIG. 2A is a block diagram showing another exemplary arrangement of the magnetic field sensing element and the self-test conductor of FIG. 1.

Referring now to FIG. 2A, in which like elements of FIGS. 1 and 2 are shown having like reference designations, a self-test current conductor 30" is proximate to the magnetic field sensing element 32. The self-test current conductor 30" forms a single-turn loop around the magnetic field sensing element 32. When a current in the direction of the arrows on the conductor 30" passes through the self-test current conductor 30", a self-test magnetic field 60b is generated and is received by the magnetic field sensing element 32 as a magnetic field generally perpendicular to a major surface of the magnetic field sensing element 32. Thus, this arrangement is also generally suitable for most types of Hall effect elements.

It will be understood that the self-test magnetic field 60b is larger than the self-test magnetic field 60a of FIG. 2 when the self-test current is the same.

The self-test magnetic field 60b can be a pulsed magnetic field generated by a pulsed current carried by the self-test current conductor 30". The self-test magnetic field 60b physically adds to any other magnetic field (not shown), e.g., the measured magnetic field, experienced by the magnetic field sensing element 32.

Figure 2B:
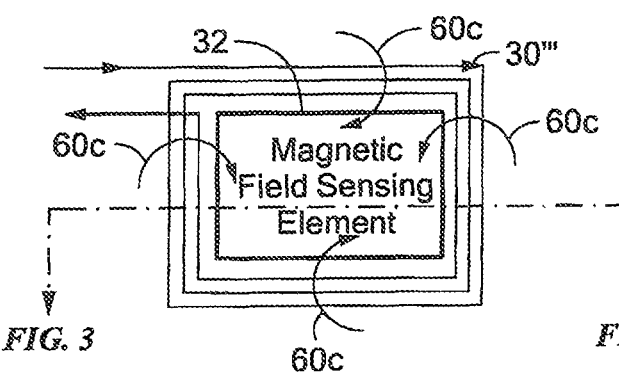
FIG. 2B is a block diagram showing yet another exemplary arrangement of the magnetic field sensing element and the self-test conductor of FIG. 1.

Referring now to FIG. 2B, in which like elements of FIGS. 1, 2 and 2A are shown having like reference designations, a self-test current conductor 30''' is proximate to the magnetic field sensing element 32. The self-test current conductor 30''' forms a multi-turn loop or coil around the magnetic field sensing element 32. When a current in the direction of the arrows on the conductor 30''' passes through the self-test current conductor 30''', a self-test magnetic field 60c is generated and is received by the magnetic field sensing element 32 as a magnetic field generally perpendicular to a major surface of the magnetic field sensing element 32. Thus, this arrangement is also generally suitable for most types of Hall effect elements.

It will be understood that the self-test magnetic field 60c is larger than the self-test magnetic field 60a of FIG. 2 and the self-test magnetic field 60b of FIG. 2A when the self-test current is the same.

The self-test magnetic field 60c can be a pulsed magnetic field generated by a pulsed current carried by the self-test current conductor 30'''. The self-test magnetic field 60c physically adds to any other magnetic field (not shown), e.g., the measured magnetic field, experienced by the magnetic field sensing element 32.

Figure 2C:
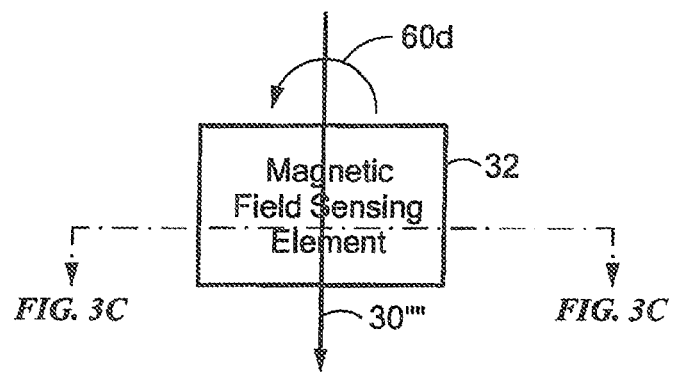
FIG. 2C is a block diagram showing yet another exemplary arrangement of the magnetic field sensing element and the self-test conductor of FIG. 1.

Referring now to FIG. 2C, in which like elements of FIGS. 1, 2, 2A, and 2B are shown having like reference designations, a self-test current conductor 30'''' is proximate to the magnetic field sensing element 32. When a current in the direction of the arrow on the conductor 30'''' passes through the self-test current conductor 30'''', a self-test magnetic field 60d is generated and is received by the magnetic field sensing element 32 as a magnetic field generally parallel to a major surface of the magnetic field sensing element 32. Thus, this arrangement is generally suitable for most types of magnetoresistance elements.

The self-test magnetic field 60d can be a pulsed magnetic field generated by a pulsed current carried by the self-test current conductor 30"". The self-test magnetic field 60d physically adds to any other magnetic field (not shown), e.g., the measured magnetic field, experienced by the magnetic field sensing element 32.

Figure 2D:
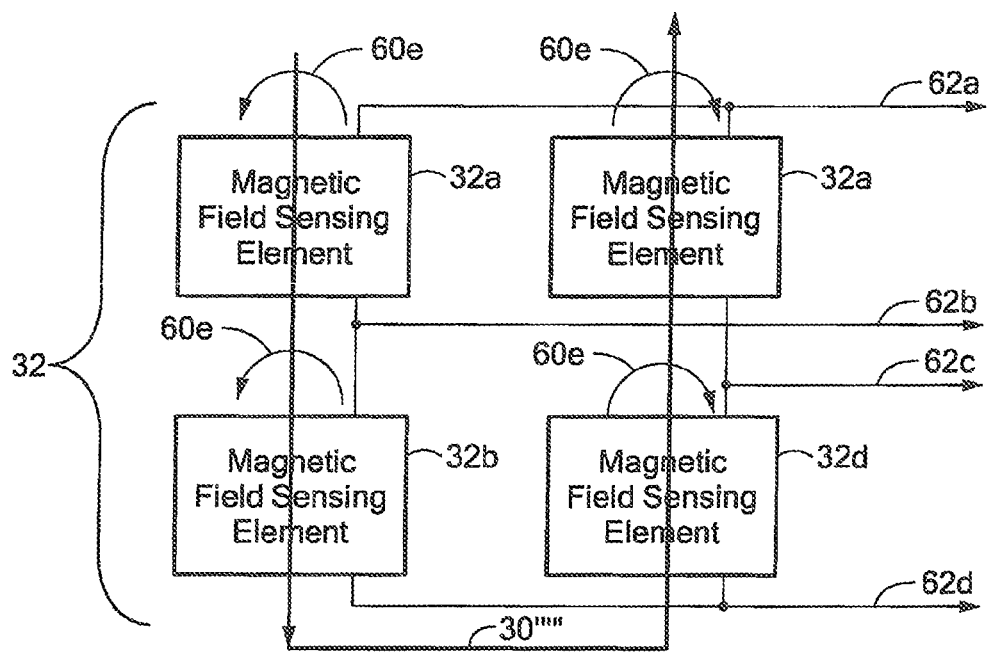
FIG. 2D is a block diagram showing yet another exemplary arrangement of the magnetic field sensing element, here shown as four magnetic field sensing elements, and the self-test conductor of FIG. 1.

Referring now to FIG. 2D, in which like elements of FIGS. 1, 2, 2A, 2B, and 2C are shown having like reference designations, a self-test current conductor 30""'" is proximate to the magnetic field sensing element 32. The magnetic field sensing element 32 is comprised of four magnetic field sensing elements 32a-32d. When a current in the direction of the arrow on the conductor 30""'" passes through the self-test current conductor 30""'", a self-test magnetic field 60e is generated and is received by the magnetic field sensing elements 32a-32d as a magnetic field generally parallel to major surfaces of the magnetic field sensing elements 32a-32d. Thus, this arrangement is generally suitable for most types of magnetoresistance elements.

The self-test magnetic field 60e can be a pulsed magnetic field generated by a pulsed current carried by the self-test current conductor 30""'". The self-test magnetic field 60e physically adds to any other magnetic field (not shown), e.g., the measured magnetic field, experienced by the magnetic field sensing elements 32a-32d. In some arrangements, node 62a can be coupled to a power supply voltage, for example, Vcc, node 62d can be coupled to a voltage reference, for example, ground, and nodes 62b, 62c can provide a differential output signal.

Figure 3:
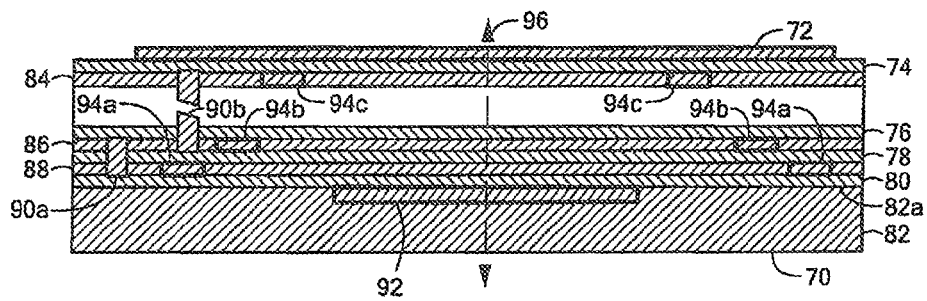
FIG. 3 is block diagram showing a cross section representative of one exemplary arrangement of the magnetic field sensing element and the self-test conductor of FIG. 1, namely, the magnetic field sensing element and the self-test conductor of FIG. 2B, wherein the arrangement includes an electromagnetic shield.

Referring now to FIG. 3, a cross section of a portion of a magnetic field sensor 70 is representative of the magnetic field sensing element 32 and self-test current conductor 30'" of FIG. 2B. The magnetic field sensor 70 includes a magnetic field sensing element 92 supported by a substrate 82 having a surface 82a. The magnetic field sensing element 92 may be impregnated into or diffused into and below the surface 82a of the substrate 82, such as is known for manufacturing of Hall effect elements. The magnetic field sensing element 92 can have a maximum response axis 96 generally perpendicular to the surface 82a of the substrate 82.

The magnetic field sensor 70 can include metal layers 84, 86, 88 separated by insulating layers 76, 78, 80. Other metal and insulating layers (not shown) can be disposed between the conductive layer 76 and the metal layer 84. An electromagnetic shield 72 can be disposed over another insulating layer 74.

Sections 94a-94c are representative of a coil self-test conductor, such as the self-test conductor 30'" of FIG. 2B and representative of the self-test conductor 30 of FIG. 1. The sections 94a-94c can form one continuous self-test conductor, here disposed on different ones of the metal layers 84, 86, 88 and coupled by way of vias 90a, 90b. A self-test current carried by the self-test conductor 94a-94c tends to form a self-test magnetic field along the maximum response axis 96.

Figure 3A:
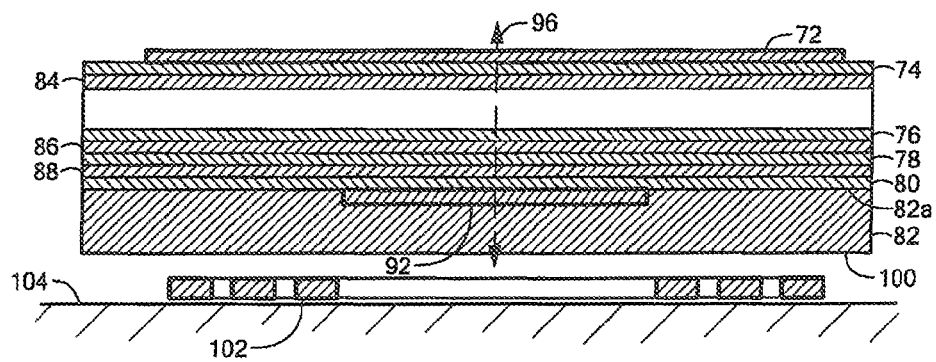
FIG. 3A is block diagram showing a cross section representative of another exemplary arrangement of the magnetic field sensing element and the self-test conductor of FIG. 1, wherein the arrangement includes an electromagnetic shield.

Referring now to FIG. 3A, in which like elements of FIG. 3 are shown having like reference designations, a magnetic field sensor 100 can include all of the layers of the magnetic field sensor 70 of FIG. 3 and also the magnetic field sensing element 92 of FIG. 3, but the self-test conductor 94a-94c of FIG. 3 can be replaced by a continuous external coil self-test conductor 102, which, in some embodiments, can be disposed upon a circuit board 104. The external self-test conductor 102 is representative of the external self-test conductor 18 of FIG. 1. The self-test conductor 102, shown on one metal layer of the circuit board 104, can instead be formed from a plurality of metal layers upon the circuit board 104. A self-test current carried by the self-test conductor 102 tends to form a self-test magnetic field along the maximum response axis 96.

Figure 3B:
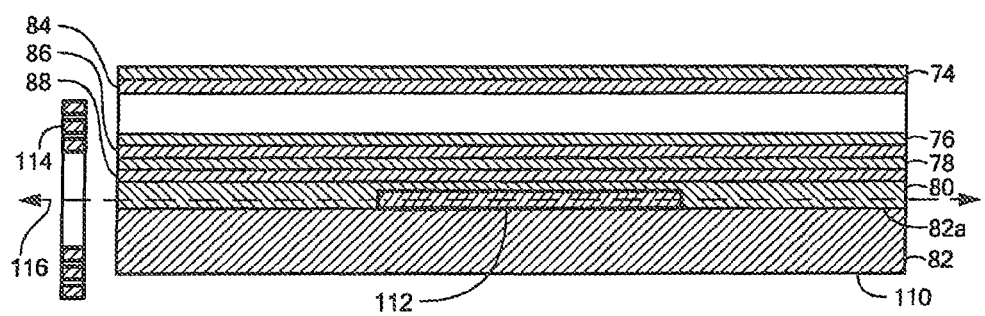
FIG. 3B is block diagram showing a cross section representative of yet another exemplary arrangement of the magnetic field sensing element and the self-test conductor of FIG. 1.

Referring now to FIG. 3B, in which like elements of FIGS. 3 and 3A are shown having like reference designations, a magnetic field sensor 110 can include all of the layers of the magnetic field sensors 70 of FIGS. 3 and 100 of FIG. 3A, but the external self-test conductor 102 of FIG. 3A can be replaced by a continuous external coil self-test conductor 114. Furthermore, the magnetic field sensing element 92 of FIGS. 3 and 3A can be replaced by a magnetic field sensing element 112 having a maximum response axis 116 generally parallel to the surface 82a of the substrate 82. The external self-test conductor 114 is representative of the external self-test conductor 18 of FIG. 1.

The magnetic field sensing element 112 may be disposed on or near the surface 82a of the substrate 82, such as is known for manufacturing of magnetoresistance elements. The magnetic field sensing element 92 can have a maximum response axis 116 generally parallel to the surface 82a of the substrate 82. A self-test current carried by the self-test conductor 114 tends to form a self-test magnetic field along the maximum response axis 116.

Figure 3C:
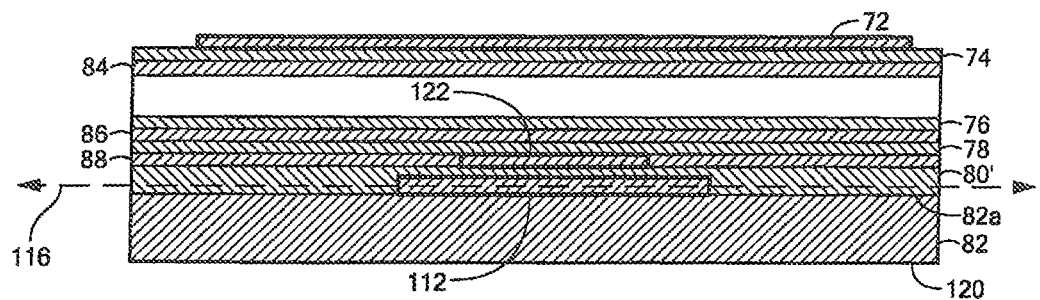
FIG. 3C is block diagram showing a cross section representative of yet another exemplary arrangement of the magnetic field sensing element and the self-test conductor of FIG. 1, namely, the magnetic field sensing element and the self-test conductor of FIG. 2C, wherein the arrangement includes an electromagnetic shield.

Referring now to FIG. 3C, in which like elements of FIGS. 3-3B are shown having like reference designations, a magnetic field sensor 120 can include all of the layers of the magnetic field sensors 70, 100 and 110 of FIGS. 3, 3A, and 3B, respectively, and also the magnetic field sensing element 112 of FIG. 3B, but the external self-test conductor 114 of FIG. 3B can be replaced by an internal single conductor self-test conductor 122. The self-test conductor 122 is representative of the self-test conductor 30 of FIG. 1 and the self-test conductor 30"" of FIG. 2C.

A self-test current carried by the self-test conductor 122 tends to form a self-test magnetic field along the maximum response axis 116.

Figure 3D:
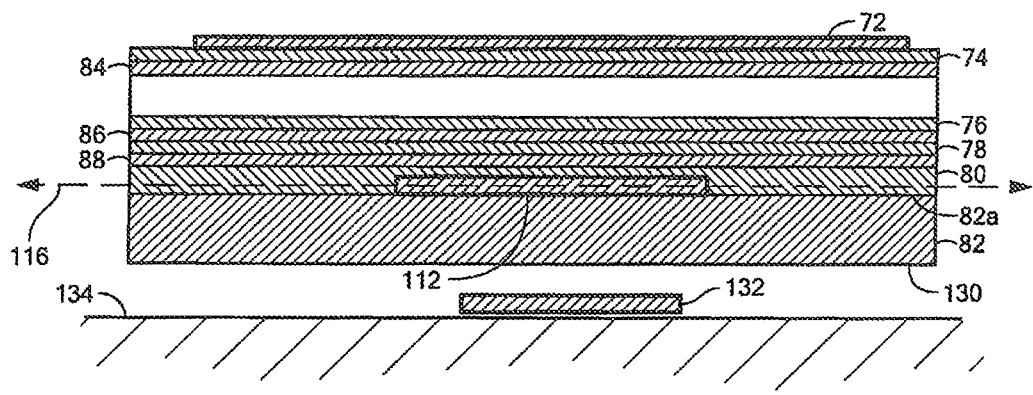
FIG. 3D is block diagram showing a cross section representative of yet another exemplary arrangement of the magnetic field sensing element and the self-test conductor of FIG. 1, wherein the arrangement includes an electromagnetic shield.

Referring now to FIG. 3D, in which like elements of FIGS. 3-3C are shown having like reference designations, a magnetic field sensor 130 can include all of the layers of the magnetic field sensors 70, 100, 110, and 120 of FIGS. 3, 3A, 3B, and 3C, respectively, but the internal self-test conductor 122 of FIG. 3C can be replaced by an external single conductor self-test conductor 132, which, in some embodiments, can be disposed upon a circuit board 134. The self-test conductor 132 is representative of the external self-test conductor 18 of FIG. 1.

A self-test current carried by the self-test conductor 132 tends to form a self-test magnetic field along the maximum response axis 116.

While FIGS. 3-3D show various alternative embodiments associated with the magnetic field sensing element 32 and self-test current conductors 30, 18 or FIG. 1, it will be recognized that there are many other possible configurations, including, but not limited to, combinations of the configurations shown.

While FIGS. 3-3D are representative of portions of magnetic field sensors 70, 100, 110, 120, 130, it should be understood that the magnetic field sensing element 32 and self-test current conductor 30 of FIG. 1 can be disposed on the same substrate as other portions of the magnetic field sensor 10 of FIG. 1, or, in other embodiments on a second different substrate from the other portions of the magnetic field sensor 10 of FIG. 1.

Referring now to FIG. 3E, a magnetic field sensor 144, here encased in a package 142, can be the same as or similar to the magnetic field sensor 10 of FIG. 1. The magnetic field sensor 144 can be coupled to a lead frame having leads 146. The leads 146 can be electrically coupled to a circuit board 150.

The magnetic field sensor 144 can be responsive to a magnetic field 148 perpendicular to a major surface of the magnetic field sensor 144, such as may be generated by proximity of a magnetic field source 140, for example, a hard ferromagnetic object.

Referring now to FIG. 3F, a magnetic field sensor 156, here encased in a package 154, can be the same as or similar to the magnetic field sensor 10 of FIG. 1. The magnetic field sensor 156 can be coupled to a lead frame having leads, of which leads 160a, 160b are representative. The leads, e.g., 160a, 160b, can be electrically coupled to a circuit board 150. The magnetic field sensor 156 can be responsive to a magnetic field 164 parallel to a major surface of the magnetic field sensor 156, such as may be generated by proximity of a magnetic field source 152, for example, a hard ferromagnetic object.

Also shown, in some alternate embodiments, the leads can be coupled with a measured conductor 158, which can be formed as a part of the lead frame of which the leads 160a, 160b are another part. A measured current carried by the measured conductor 158 tends to form a magnetic field 162 going into or out of the page, depending upon a direction of the current carried by the measured conductor 158. For these arrangements, the magnetic field sensor 156 can be a current sensor and the magnetic field sensor 156 can instead be responsive to the magnetic field 162 perpendicular to the major surface of the magnetic field sensor 156 (i.e., to the current) rather than to the magnetic field 164.

Referring now to FIG. 3G, a magnetic field sensor 170, here encased in a package 168, can be the same as or similar to the magnetic field sensor 10 of FIG. 1. The magnetic field sensor 170 can be coupled to a lead frame having leads, of which a lead 174 is representative. The leads, e.g., 174, can be electrically coupled to a circuit board 176. The magnetic field sensor 170 can be responsive to a magnetic field generated by proximity of a magnetic field source 172 within the package 168. For example, the magnetic field source 172 can be a measured current conductor similar to the measured current conductor 158 of FIG. 3F.

Figure 4:
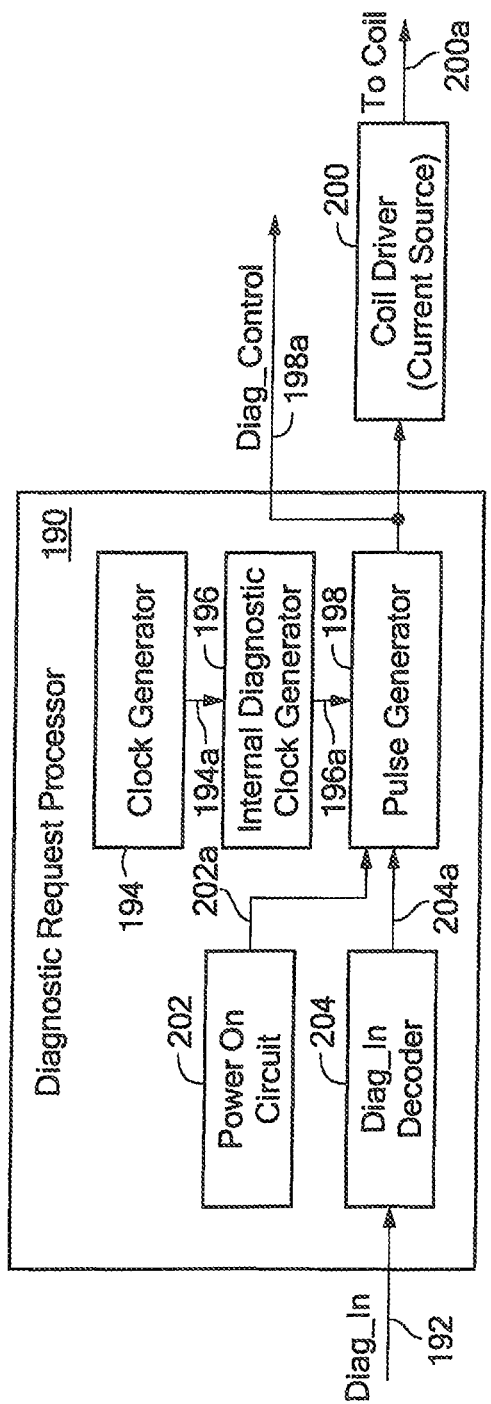
FIG. 4 is a block diagram showing further details of the diagnostic request processor of FIG. 1.

Referring now to FIG. 4, a diagnostic request processor 190 can be the same as or similar to the diagnostic request processor 58 of FIG. 1. The diagnostic request processor 190 can be coupled to receive a diagnostic input signal 192, which can be the same as or similar to the diagnostic input signal 23 of FIG. 1. The diagnostic request processor 190 can include a diagnostic input decoder 204 to receive and to decode the diagnostic input signal 192. The diagnostic input decoder 204 can generate a decoded diagnostic signal 204a.

The diagnostic request processor 190 can also include a pulse generator 198 coupled to receive the decoded diagnostic signal 204a and configured to generate a diagnostic control signal 198a having pulses in response to the decoded diagnostic signal 204a. The diagnostic control signal 198a can be the same as or similar to the diagnostic control signal 58a of FIG. 1.

The diagnostic request processor 190 can also include a clock generator 194 configured to generate a periodic clock signal 194a. The diagnostic request processor 190 can also include an internal diagnostic clock generator 196 coupled to receive the clock signal 194a and configured to generate a periodic diagnostic clock signal 196a.

The pulse generator 198 can be coupled to receive the diagnostic clock signal 196a and can be configured to generate the diagnostic control signal 198a having pulses synchronized with the diagnostic clock signal 196a.

Thus, there can be at least two ways to control the pulse generator 198 and associated diagnostics events, i.e., pulses within the diagnostic input signal 198a. As described above, the pulse generator 198 can be responsive to the diagnostic input signal 192. Alternatively, the pulse generator 198 can be responsive to the control signal 196a instead of, or in addition to, the diagnostic input signal 192. When responsive to the control signal 196a, the pulse generator 198 can generate pulses at periodic time intervals, or groups of pulses at periodic time intervals.

The diagnostic request processor 190 can also include a power on circuit 202 coupled to generate power on signal 202a having a first state for a predetermined period of time after the magnetic field sensor, e.g., the magnetic field sensor 10 of FIG. 1, is first powered on, followed by a second different state. The pulse generator 196 can be coupled to receive the power on signal 202a and can be further responsive to the power on signal 202a such that the pulse generator 198 also generates pulses in the diagnostic control signal 198a in response to the power on signal 202a.

In some embodiments, the diagnostic clock signal 196a has a frequency in the range of about ten Hz to one hundred Hz. However, the diagnostic clock signal 196a can also have a frequency higher than one hundred Hz (e.g., one thousand Hz) or lower than ten Hz (e.g., one Hz) or anywhere in between ten Hz and one hundred Hz.

In some embodiments, the pulse generator 198 generates pulses having a period between about one μs and ten μs in the diagnostic control signal 198a. However, the pulse generator 198 can also generate pulses having a period greater than ten μs (e.g., one hundred μs) or less than one μs (e.g., 0.1 μs) or anywhere in between one μs and ten μs.

The diagnostic control signal 198a can be received by a coil driver circuit 200, for example, a current source, which can be the same as or similar to the coil driver circuit 24 of FIG. 1. The coil driver circuit 200 can generate a self-test current signal 200a, which is received by a self-test current conductor the same as or similar to the self-test current conductor 30 of FIG. 1 or the external coil 18 of FIG. 1.

Figure 5:
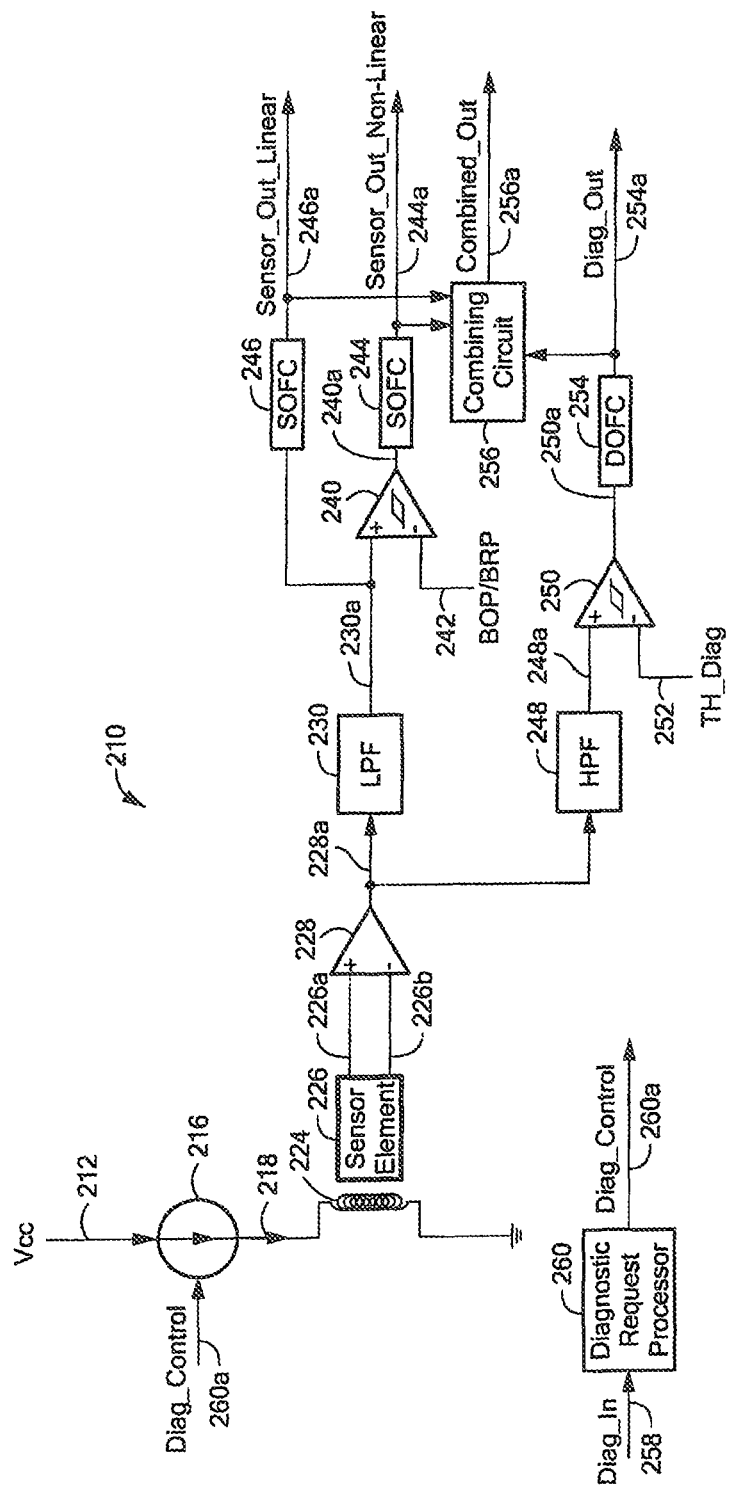
FIG. 5 is a block diagram of an exemplary magnetic field sensor showing further details of the magnetic field sensing element, the self-test conductor, and the signal processor of FIG. 1.

Referring now to FIG. 5, a magnetic field sensor 210 can be the same as or similar to the magnetic field sensor 10 of FIG. 1. The magnetic field sensor 210 can include a current source 216 coupled to receive a supply voltage signal 212 and configured to generate a self-test current signal 218. The current source 216 can be the same as or similar to the coil driver 24 of FIG. 1.

The magnetic field sensor 210 can also include a self-test current conductor 224 coupled to receive and carry the self-test current signal 218. While the self-test current conductor 224 is shown to be a coil, from FIGS. 2-2D, it will be understood that the self-test current conductor 224 can have one of a variety of arrangements.

The magnetic field sensor 210 can also include a magnetic field sensing element 226 proximate to the self-test current conductor 224 such that the magnetic field sensing element 226 can receive a self-test magnetic field generated by the current 218 carried by the self-test current conductor 224. The magnetic field sensing element 226 can also receive a measured magnetic field associated with a magnetic field generator (not shown) that the magnetic field sensor 210 is intended to measure. Thus, the magnetic field sensor is configured to generate a differential composite magnetic field signal 226a, 226b comprising a measured-magnetic-field-responsive signal portion and a self-test-responsive signal portion.

The magnetic field sensor 210 can also include an amplifier 228 coupled to receive the composite magnetic field signal 226a, 226b and configured to generate an amplified signal 228a representative of the composite magnetic field signal 226a, 226b.

The magnetic field sensor 210 can also include a low pass filter 230 and a high pass filter 248, each coupled to receive the amplified signal 228a. The low pass filter 230 is configured to generate a filtered signal 230a and the high pass filter 248 is configured to generate a filtered signal 248a.

A comparator 240 can be coupled to receive the filtered signal 230a. The comparator 240 can have hysteresis or other circuit techniques to result in two thresholds 242, a magnetic field operate point (BOP) and a magnetic field release point (BRP). The BOP and BRP thresholds 242, in some embodiments, can be separated by a voltage equivalent to about five Gauss received by the magnetic field sensing element 226. In other embodiments, the BOP and BRP thresholds 242 can be separated by a voltage equivalent to about fifty Gauss received by the magnetic field sensing element 226. However, the BOP and BRP thresholds 242 can be separated by a voltage equivalent to a magnetic field anywhere between about five and fifty Gauss. The BOP and BRP thresholds 242 can also be separated by a voltage equivalent to a magnetic field smaller than five Gauss or larger than fifty Gauss. The comparator 240 is configured to generate a two state comparison signal 240a.

A comparator 250 can be coupled to receive the filtered signal 248a. The comparator 250 can have hysteresis or other circuit techniques to result in two thresholds, which can be relatively closely spaced about a diagnostic threshold voltage (TH_Diag) 252. In some embodiments, the hysteresis associated with the diagnostic threshold voltage 252 is about fifty millivolts. The comparator 250 is configured to generate a two state comparison signal 250a.

The magnetic field sensor 210 can also include a sensor output formatting circuit (SOFC) 244 coupled to receive the comparison signal 240a and configured to generate a sensor non-linear output signal 244a. The SOFC 244 can be the same as or similar to the sensor output formatting circuit 52 of FIG. 1.

The magnetic field sensor 210 can also include a diagnostic output formatting circuit (DOFC) 254 coupled to receive the comparison signal 250a and configured to generate a diagnostic output signal 254a. The DOFC 254 can be the same as or similar to the diagnostic output formatting circuit 56 of FIG. 1.

The magnetic field sensor 210 can also include a combining circuit 256 coupled to receive the sensor non-linear output signal 244a, coupled to receive the diagnostic output signal 254a, and configured to generate a combined output signal 256a. The combining circuit 256 can be the same as or similar to the combining circuit 54 of FIG. 1.

The magnetic field sensor 210 can also include another SOFC 246 coupled to receive the filtered signal 230a and configured to generate a sensor linear output signal 246a. The SOFC 246 can be the same as or similar to the sensor output formatting circuit 52 of FIG. 1.

The magnetic field sensor 210 can also include a diagnostic request processor 260 coupled to receive a diagnostic input signal 258 and configured to generate a diagnostic control signal 260a. The diagnostic request processor 260 can be the same as or similar to the diagnostic request processor 58 or FIG. 1 or the diagnostic request processor 190 of FIG. 4. Operation of the diagnostic request processor 260 can be as is described above in conjunction with FIG. 4 and is further described below in conjunction with FIGS. 7-7F.

In operation, upon activation of the diagnostic control signal 260a, the current source 216 can generate one or more current pulses 218, which are carried by the self-test conductor 224 resulting in a self-test magnetic field received by the magnetic field sensing element 226. It will be understood that the self-test magnetic field, and therefore, the self-test-responsive signal portion of the composite magnetic field signal 226a, 226b, can have a frequency content that is generally above a frequency content of a measured magnetic field that the magnetic field sensor 210 is intended to measure. Therefore, the filtered signal 248a can be comprised predominantly of the self-test-responsive signal portion, i.e., pulses, and the filtered signal 230a can be comprised predominantly of the measured-magnetic-field-responsive signal portion. Therefore, by way of the filters 230, 248, the composite magnetic field signal 226a, 226b is split into its two components, the self-test-responsive signal portion and the measured-magnetic-field-responsive signal portion.

In one particular embodiment, the low pass filter 230 has a break frequency of about two hundred kHz and the high pass filter 248 has a break frequency above about two hundred kHz, such that the signal 248a tends to represent the self-test-responsive signal portion of the composite magnetic field signal 226a, 226b. Accordingly, in some embodiments, the measured magnetic field can have a frequency below about two hundred kHz.

It will be understood that the comparator 250 and the diagnostic threshold 252 can assure that the pulses in the filtered signal 248a are of proper and sufficient magnitude to be indicative of proper operation of the magnetic field sensing element 226, amplifier 228, and filter 248. In operation, the comparator 250 generates the two-state comparison signal 250a, i.e., pulses, only when the pulses in the filtered signal 248a are proper. Pulses of the comparison signal 250a can be reformatted into any format by the DOFC 254 to generate the diagnostic output signal 254a. Exemplary formats of the diagnostic output signal 254a are described below in conjunction with FIGS. 8A-8D.

As described above, the filtered signal 230a is predominantly comprised of the measured-magnetic-field-responsive signal portion. The SOFC 246 can reformat the filtered signal 230a into any format to generate the sensor linear output signal 246a. In one particular embodiment, the SOFC 246 merely passes the filtered signal 230a through the SOFC 246, in which case no reformatting occurs.

The comparison signal 240a can be indicative of the magnetic field sensor 210 that operates as a magnetic switch. For example, when the magnetic field sensing element 226 is close to a measured magnetic object, resulting in a magnetic field at the magnetic field sensing element 226 greater than an operating point, the comparison signal 240a has a first state, and when the magnetic field sensing element 226 is not close to the measured magnetic object, resulting in a magnetic field at the magnetic field sensing element 226 less than a release point, the comparison signal 240a has a second different state. The SOFC 244 can reformat the comparison signal 240a into any format to generate the sensor non-linear output 244a. In one particular embodiment, the SOFC 244 merely passes the comparison signal 240a through the SOFC 244, in which case no reformatting occurs.

While many of the blocks of the magnetic field sensor 210 are shown to be analog blocks, it should be appreciated that similar functions can be performed digitally.

Figure 5A:
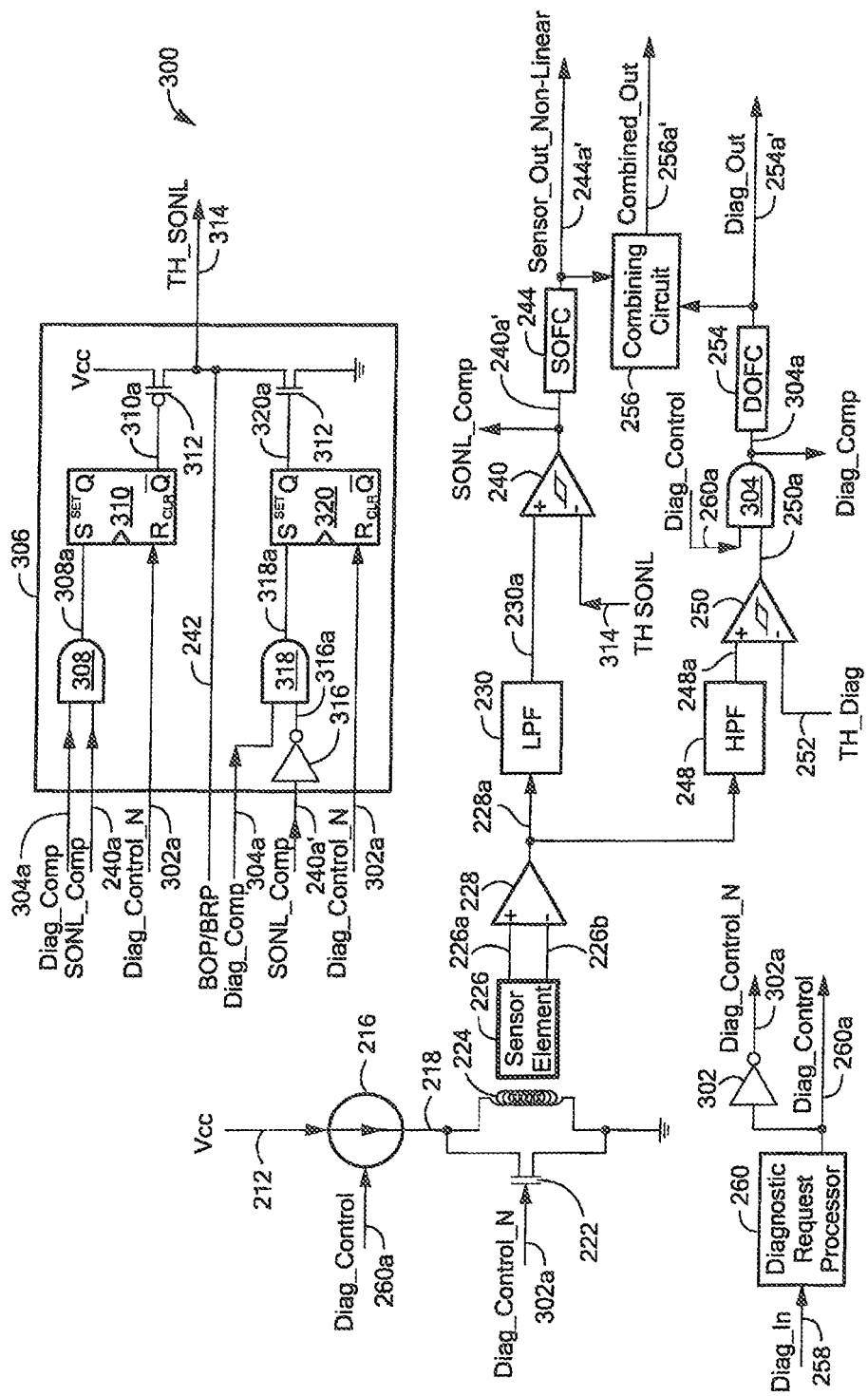
FIG. 5A is a block diagram of another exemplary magnetic field sensor showing further details of the magnetic field sensing element, the self-test conductor, and the signal processor of FIG. 1.

Referring now to FIG. 5A, in which like elements of FIG. 5 are shown having like reference designations, a magnetic field sensor 300 includes all of the components of the magnetic field sensor 210 of FIG. 5. In addition, the magnetic field sensor 300 includes an inverter 302 configured to generate an inverted diagnostic control signal 302a. The magnetic field sensor 300 also includes an AND gate 304 coupled to receive the comparison signal 250a, coupled to receive the diagnostic control signal 260a, and configured to generate a diagnostic comparison signal 304a. The magnetic field sensor 300 also includes a switch 222, which can be a FET, coupled across the self-test current conductor 224 and controlled by the inverted diagnostic control signal 302a. The magnetic field sensor 300 also includes a logic circuit 306 configured to generate a sensor non-linear threshold (TH_SONL) 314 received by the amplifier 240 in place of the BOP/BRP threshold 242 of FIG. 5. Each of these added elements improves operation of the magnetic field sensor 210 of FIG. 5 in ways further described below.

The logic circuit 306 can include an AND gate 308 coupled to receive the diagnostic comparison signal 304a, coupled to receive the non-linear sensor comparison signal 240a, and configured to generate a logic signal 308a. The logic signal 308a can be received at a set node of a set/reset flip-flop 310. The set/reset flip-flop 310 can also be coupled to receive the inverted diagnostic control signal 302a at a reset node. The set/reset flip-flop 310 can be configured to generate a control signal 310a received by a p-channel FET 312 acting as a switch to a power supply, Vcc.

The logic circuit 306 can include an inverter 316 coupled to receive the non-linear sensor comparison signal 240a' and configured to generate an inverted signal 316a. The logic circuit 306 can also include another AND gate 318 coupled to receive the diagnostic comparison signal 304a, coupled to receive the inverted signal 316a, and configured to generate a logic signal 318a. The logic signal 318a can be received at a set node of another set/reset flip-flop 320. The set/reset flip-flop 320 can also be coupled to receive the inverted diagnostic control signal 302a at a reset node. The set/reset flip-flop 320 can be configured to generate a control signal 320a received by an n-channel FET 322 acting as a switch to ground. A source of the FET 312 can be coupled to a drain of the FET 322, forming a junction node. The BOP/BRP thresholds can also be received at the junction node. At the junction node, the sensor output non-linear threshold signal 314 is generated.

With this arrangement, it should be understood that at some times, the sensor output non-linear threshold 314 is equal to BOP, at other times it is equal to BRP, at other times it is equal to Vcc, and at other times it is equal to ground.

Referring briefly to FIG. 5, it should be understood that the self-test current 218 and resulting self-test-responsive signal portion of the composite magnetic field signal 226a, 226b does not pass through the comparator 240 or the SOFC 244. Thus, the comparator 240 and SOFC 244 are essentially excluded from the self-test.

Referring again to FIG. 5A, the logic circuit 306 provides that the comparator 240 and SOFC are included in the self-test in the following way. Whenever a diagnostic pulse occurs in the self-test current signal 218, the non-linear sensor output threshold 314 is pulled either to Vcc or to ground. At other times, the non-linear sensor output threshold 314 behaves as in FIG. 5, wherein the non-linear sensor output threshold 314 is either at a BOP or BRP voltage value. Thus, the sensor non-linear output signal 244a' (where the prime symbol is representative of a difference from the signal 244a of FIG. 5) makes state transitions not only responsive to a measured magnetic object near to or far from the magnetic field sensing element 226, but also makes transitions when self-test pulses occur. It should be recognized that the same result may not be achieved by merely removing the filter 230, for example, in the case where the measured magnetic field is much greater than the self-test magnetic field, wherein the comparator 240 would not switch in the presence of the self-test-responsive signal portion. This function is further described in conjunction with FIGS. 10-10B.

The addition of the AND gate 304 having an input node coupled to receive the diagnostic control signal 260a results in removal of a possibility that any extraneous spikes or noise pulses in the comparison signal 250a could pass though to the diagnostic output signal 254a when no self-test current pulse 218 is ongoing. Such spikes could result from external magnetic field noise or pulses experienced by the magnetic field sensor 300.

The switch 222 also provides improved function. The switch 222 is only opened when a self-test current pulse 218 is ongoing. The switch is closed at other times. Thus, any external noise or magnetic fields experienced by the magnetic field sensor 300 will not be picked up by the self-test conductor at times when no self-test current pulses 218 are occurring.

Basic operation of the current sensor 300 is described above in conjunction with FIG. 5. The sensor non-linear output signal 244a' is described below in conjunction with FIG. 10B.

Figure 5B:
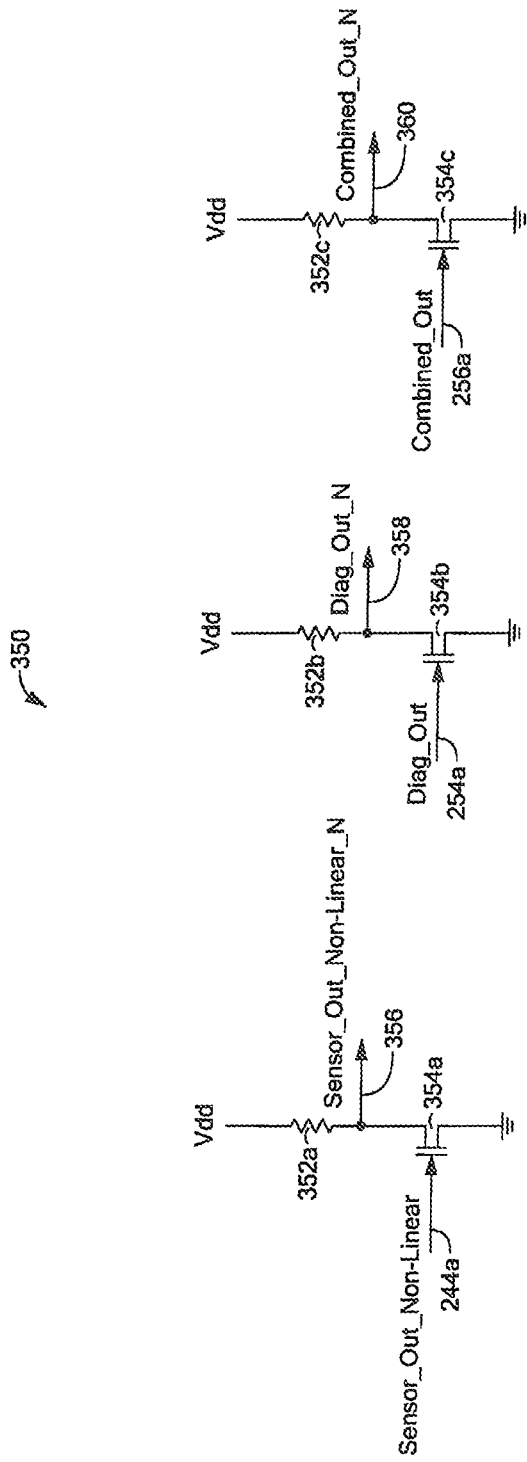
FIG. 5B is a block diagram showing common drain output circuits that can be used as part of the magnetic field sensors of FIGS. 5 and 5A.

Referring now to FIG. 5B, in which like elements of FIGS. 1, 5, and 5A are shown having like reference designations, output circuits 350 can be included as part of the magnetic field sensors 210, 300 of FIGS. 5 and 5A or any other magnetic field sensors shown or described herein. Output circuits 350 can include resistors 352a-352c coupled to a power supply, Vdd, and coupled to a respective drain of respective FETs 354a-354c. FET 354a can be coupled to receive the sensor non-linear output signal 244a at a gate node and configured to generate an inverted sensor non-linear output signal 356. FET 354b can be coupled to receive the diagnostic output signal 254a at a gate node and configured to generate an inverted diagnostic output signal 358. FET 354c can be coupled to receive the combined output signal 256a at a gate node and configured to generate an inverted combined output signal 360.

In some embodiments, the FETs 354a-354c are within an integrated magnetic field sensor, and the resistors 352a-352c and the power supply, Vdd, are outside of the integrated magnetic field sensor. However, in other embodiments, both the FETs 354a-354c and the resistors 352a-352c are within the integrated current sensor. In still other embodiments, other output circuit arrangements can be used, for example, using bipolar transistors or using a push pull configuration.

Figure 6:
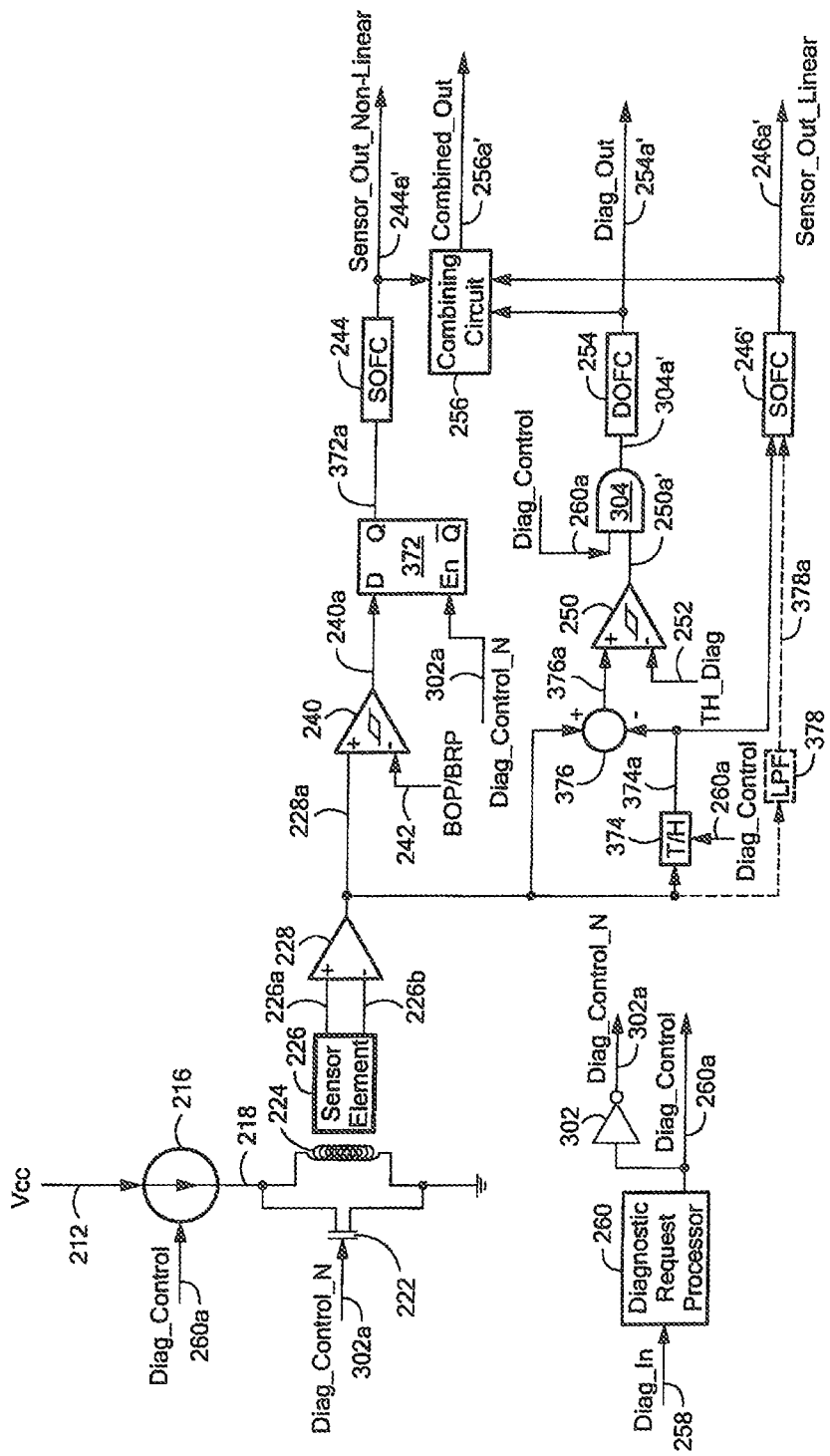
FIG. 6 is a block diagram of another exemplary magnetic field sensor showing further details of the magnetic field sensing element, the self-test conductor, and the signal processor of FIG. 1.

Referring now to FIG. 6, in which like elements of FIGS. 1, 5, and 5A are shown having like reference designations, a magnetic field sensor 370 is similar to the magnetic field sensor 210 of FIG. 5, however, the magnetic field sensor 370 includes a transparent latch 372 coupled between the comparator 240 and the SOFC 244, coupled to receive the comparison signal 240a at an input port and configured to generate a latched signal 372a at an output port, which is received by the SOFC 244. The transparent latch 372 is also coupled to receive the inverted diagnostic control signal 302a at an enable port.

The magnetic field sensor 370 also includes a track-and-hold circuit 374 coupled to receive the amplified signal 228a and configured to generate a tracking signal 374a. The track-and-hold circuit 374 is also coupled to receive the diagnostic control signal 260a at a control node such that the track-and-hold circuit holds whenever a current pulse appears in the self-test current signal 218 and tracks otherwise. The magnetic field sensor 370 also includes a differencing circuit 376 coupled to receive the amplified signal 228a, coupled to receive the tracking signal 374a, and configured to generate a difference signal 376a received by the comparator 250 in place of the filtered signal 248a of FIG. 5. The magnetic field sensor 370 also includes the AND gate 304 of FIG. 5A coupled to receive a comparison signal 250a', similar to the comparison signal 250a of FIGS. 5 and 5A, where the prime symbol is representative of a similar signal. The magnetic field sensor 370 can also include an optional low pass filter 378 coupled to receive the amplified signal 228a and configured to generate a filtered signal 378a, which can be the same as or similar to the filtered signal 230a of FIG. 5.

In operation, the transparent latch 372 is transparent only when the self-test current signal 218 does not contain a current pulse. Therefore, the latched signal 372a, which is intended to be representative of only the measured-magnetic-field-responsive signal portion of the composite magnetic field signal 226a, 226b is less likely to contain spurious transitions due to the current pulses.

In operation, the tracking signal 374a contains predominantly the measured-magnetic-field-responsive signal portion of the amplified signal 228a, since the track-and-hold circuit holds during the self-test-responsive signal portion of the amplified signal 228a. Thus, the tracking signal 374a is similar to the filtered signal 378a, which is the same as or similar to the filtered signal 230a of FIGS. 5 and 5A. The SOFC 246' can thus receive either the tracking signal 374a or the filtered signal 378a to generate the sensor linear output signal 246a'.

General operation of the magnetic field sensor 370 is similar to that described above in conjunction with FIGS. 5 and 5A, and thus, is not described further.

Referring to FIGS. 7-7F, graphs 400, 420, 430, 440, 450, 460, and 470 have vertical axes with scales in arbitrary units of volts and horizontal axes with scales in arbitrary units of time.

The graph 400 includes a sensor non-linear output signal 402 and a sensor linear output signal 408, which can be the same as or similar to the sensor non-linear output signal 244a and the sensor linear output signal 246a of FIG. 5, respectively. The sensor non-linear output signal 402 includes high states, for example, high states 404a, 404b and low states, for example, a low state 406.

The sensor linear output signal 408 is shown here as a triangle signal, but can be any linear signal. The sensor linear output signal 408 includes sections with positive slopes, for example, sections 410a, 410b, and sections with negative slopes, for example, a section 412.

The graph 420 includes an exemplary diagnostic control signal 422, which can be the same as or similar to the diagnostic control signal 260a of FIGS. 5, 5A, and 6. The graph 420 can also be representative of a diagnostic output signal, which can be the same as or similar to the diagnostic output signal 254a, 254a' of FIGS. 5, 5A, and 6 and the diagnostic control signal 198a of FIG. 4. It should be understood that the graph 420 can also be representative of current pulses in the self-test current signal 218 of FIGS. 5, 5A, and 6.

The signal 422 can include pulses, of which a pulse 424 is but one example. While the signal 422 is shown to include five pulses, other such signals 422 can include more than five or fewer than five pulses.

The graph 430 includes an exemplary diagnostic input signal 432, which can be the same as or similar to the diagnostic input signal 258 of FIGS. 5, 5A, and 6, the diagnostic input signal 23 of FIG. 1, and the diagnostic input signal 192 of FIG. 4. The exemplary diagnostic input signal 432 can include pulses, of which a pulse 434 is but one example. Each pulse of the diagnostic input signal 432 can result in one corresponding pulse of the diagnostic control signal 422 and one corresponding pulse of the diagnostic output signal 422.

While the signal 432 is shown to include five pulses, other such signals 432 can include more than five or fewer than five pulses.

The graph 440 includes another exemplary diagnostic input signal 442, which can be the same as or similar to the diagnostic input signal 258 of FIGS. 5, 5A, and 6, the diagnostic input signal 23 of FIG. 1, and the diagnostic input signal 192 of FIG. 4. The diagnostic input signal 442 can have one pulse 444. Each pulse of the diagnostic input signal 442 can result in a plurality of pulses of the diagnostic control signal 422 and a corresponding plurality of pulses of the diagnostic output signal 422.

The graph 450 includes yet another exemplary diagnostic input signal 452, which can be the same as or similar to the diagnostic input signal 258 of FIGS. 5, 5A, and 6, the diagnostic input signal 23 of FIG. 1, and the diagnostic input signal 192 of FIG. 4. The diagnostic input signal 452 can have a high state 454, a low state 456, and an edge 458. The high state 454 of the diagnostic input signal 452 can result in a plurality of pulses of the diagnostic control signal 422 and a corresponding plurality of pulses of the diagnostic output signal 422.

The graph 460 includes yet another exemplary diagnostic input signal 462, which can be the same as or similar to the diagnostic input signal 258 of FIGS. 5, 5A, and 6, the diagnostic input signal 23 of FIG. 1, and the diagnostic input signal 192 of FIG. 4. The diagnostic input signal 462 can have pulses, e.g., a pulse 464, with a first duty cycle, and pulses, e.g., a pulse 466, with a second different duty cycle. Rising edges of the pulses 464 having the first duty cycle, and including an edge 466, can each result in one corresponding pulse of the diagnostic control signal 422 and one corresponding pulse of the diagnostic output signal 422. The pulses 466 having the second different duty cycle result in no pulse in the diagnostic control signal 422 or in the diagnostic output signal 422.

The graph 470, which has a time scale expanded from that of FIGS. 7-7F includes yet another exemplary diagnostic input signal 478, which can be the same as or similar to the diagnostic input signal 258 of FIGS. 5, 5A, and 6, the diagnostic input signal 23 of FIG. 1, and the diagnostic input signal 192 of FIG. 4. The diagnostic input signal 478 can have a digital chip address 472, a digital register address 474, and digital register data 476. The diagnostic input signal 478 can result in a plurality of pulses of the diagnostic control signal 422 and a corresponding plurality of pulses of the diagnostic output signal 422.

The diagnostic input signal 478 can be in one of a variety of formats or protocols, for example, a custom protocol or a conventional protocol, for example, I2C, SENT, BiSS, LIN, or CAN.

It should be understood that each one of the diagnostic input signals 432, 442, 452, 462, and 478 can be decoded by the diagnostic input decoder 204 of FIG. 4 to result in the diagnostic output/diagnostic control signal 422.

It should be recognized that FIGS. 7B-7F show only a few exemplary types of diagnostic input signals that may be used. Many other types of diagnostic input signals can also be used.

Figure 8:
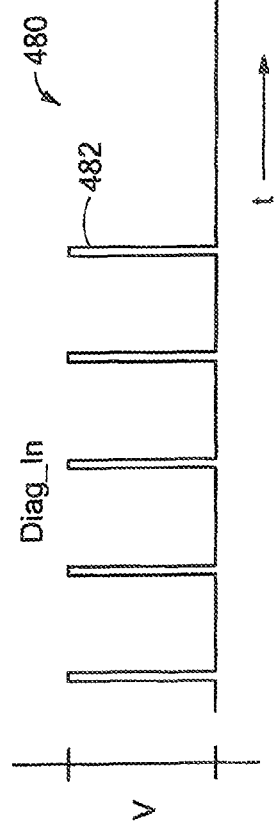
FIG. 8 is a graph showing a diagnostic input signal, the same as or similar to the diagnostic input signal of FIG. 7B, received by the diagnostic request processor of the magnetic field sensors of FIGS. 1, 5, 5A, and 6.

Referring now to FIGS. 8-8D, graphs 480, 490, 500, 510, and 520 have vertical axes with scales in arbitrary units of volts and horizontal axes with scales in arbitrary units of time.

The graph 480 includes an exemplary diagnostic input signal 482, which can be the same as or similar to the diagnostic input signal 258 of FIGS. 5, 5A, and 6, the diagnostic input signal 23 of FIG. 1, the diagnostic input signal 192 of FIG. 4, and the diagnostic input signal 432 of FIG. 7B. The exemplary diagnostic input signal 482 can include pulses, of which a pulse 484 is but one example.

The graph 490 includes an exemplary diagnostic control signal 492, which can be the same as or similar to the diagnostic control signal 260a of FIGS. 5, 5A, and 6, and the diagnostic control signal 422 of FIG. 7A. The graph 490 can also be representative of a diagnostic output signal, which can be the same as or similar to the diagnostic output signal 254a, 254a' of FIGS. 5, 5A, and 6, the diagnostic output signal 198a of FIG. 4, and the diagnostic output signal 422 of FIG. 7A. It should be understood that the graph 490 can also be representative of current pulses in the self-test current signal 218 of FIGS. 5, 5A, and 6.

The signal 492 can include pulses, of which a pulse 494 is but one example. While the signal 492 is shown to include five pulses, other such signals 492 can include more than five or fewer than five pulses.

Each pulse of the diagnostic input signal 482 can result in one corresponding pulse of the diagnostic control signal 492 and one corresponding pulse of the diagnostic output signal 492. The pulses 494 of the diagnostic output signal 492 are indicative of a self-test that is passing.

While the signal 492 is shown to include five pulses, other such signals 492 can include more than five or fewer than five pulses.

The graph 500 includes yet another exemplary diagnostic output signal 502, which can be the same as or similar to the diagnostic output signal 254a, 254a' of FIGS. 5, 5A, and 6, and the diagnostic output signal 422 of FIG. 7A. The diagnostic output signal 502 can have a high state 504, a low state 506, and an edge 508. The high state 504 of the diagnostic output signal 502 can result from a plurality of pulses 494 of the diagnostic control signal 492 or from any of the diagnostic input signals of FIGS. 7B-7F. The high state 504 of the diagnostic output signal 502 can be indicative of a self-test that is passing.

The graph 510 includes yet another exemplary diagnostic output signal 512, which can be the same as or similar to the diagnostic output signal 254a, 254a' of FIGS. 5, 5A, and 6, and the diagnostic output signal 422 of FIG. 7A. The diagnostic output signal 512 can have pulses, e.g., a pulse 514, with a first duty cycle, and pulses, e.g., a pulse 516, with a second different duty cycle. The pulses 514 having the first duty cycle and an edge 518 can each result from one corresponding pulse of the diagnostic control signal 492 or from any of the diagnostic input signals of FIGS. 7B-7F. The pulses 514 having the first duty cycle can be indicative of a self-test that is passing.

The graph 520, which has a time scale expanded from that of FIGS. 8-8C includes yet another exemplary diagnostic output signal 528, which can be the same as or similar to the diagnostic output signal 254a, 254a' of FIGS. 5, 5A, and 6, and the diagnostic output signal 422 of FIG. 7A. The diagnostic output signal 528 can have a digital chip address 522, a digital register address 524, and digital register data 526. The diagnostic output signal 522 can result from a plurality of pulses of the diagnostic control signal 492 or from any of the diagnostic input signals of FIGS. 7B-7F. Particular digital register data 526 can be indicative of a self-test that is passing.

The diagnostic output signal 528 can be in one of a variety of formats or protocols, for example, a custom protocol or a conventional protocol, for example, I2C SENT, BiSS, LIN, or CAN.

It should be recognized that FIGS. 8A-8D show only a few exemplary types of diagnostic output signals that may be generated. Many other types of diagnostic output signals can also be generated.

Figure 9C:
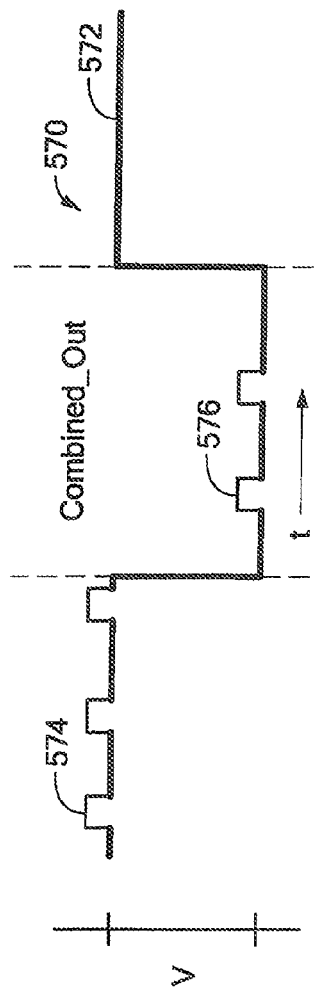
Figure 9D:
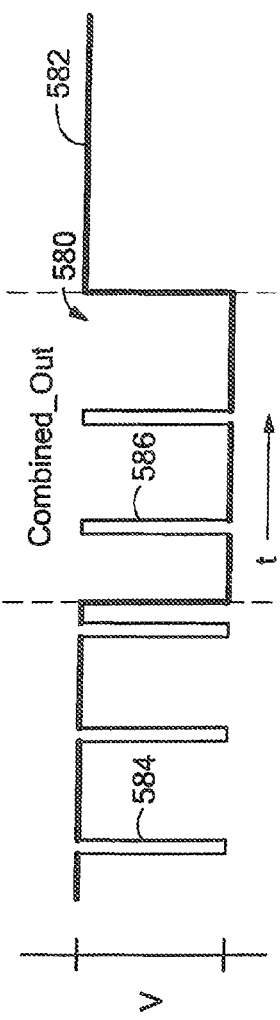
Figure 9E:
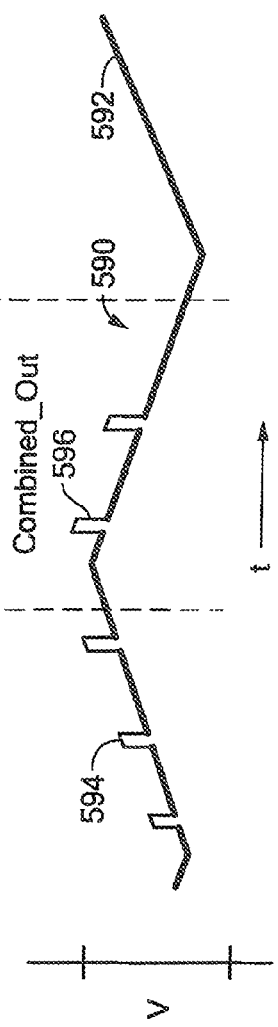

Referring now to FIGS. 9-9E, graphs 530, 550, 560, 570, 580, and 590 have vertical axes with scales in arbitrary units of volts and horizontal axes with scales in arbitrary units of time.

The graph 530, like the graph 400 of FIG. 7, includes a sensor non-linear output signal 532 and sensor linear output signal 538, which can be the same as or similar to the sensor non-linear output signal 244a and the sensor linear output signal 246a of FIG. 5, respectively. The sensor non-linear output signal 532 includes high states, for example, high states 534a, 534b, and low states, for example, a low state 536.

The sensor linear output signal 538 is shown here as a triangle signal, but can be any linear signal. The sensor linear output signal 538 includes sections with positive slopes, for example, sections 540a, 540b, and sections with negative slopes, for example, a section 542.

The graph 550, like the graph 430 of FIG. 7B and the graph 480 of FIG. 8, includes an exemplary diagnostic input signal 552, which can be the same as or similar to the diagnostic input signal 258 of FIGS. 5, 5A, and 6, the diagnostic input signal 23 of FIG. 1, and the diagnostic input signal 192 of FIG. 4. The exemplary diagnostic input signal 552 can include pulses, of which a pulse 554 is but one example.

The graph 560 includes an exemplary combined output signal 562, which can be the same as or similar to the combined output signal 256a, 256a' of FIGS. 5, 5A, and 6, and the combined output signal 54a of FIG. 1. The combined output signal 562 can include pulse groups, e.g., pulse groups 564, 566, combined with the sensor non-linear output signal 532 of FIG. 9, here shown as a dark line. The pulse groups, e.g., pulse groups 564, 566, can be indicative of a self-test that is passing.

The graph 570 includes another exemplary combined output signal 572, which can be the same as or similar to the combined output signal 256a, 256a' of FIGS. 5, 5A, and 6, and the combined output signal 54a of FIG. 1. The combined output signal 572 can include small pulses, e.g., small pulses 574, 576, combined with the sensor non-linear output signal 532 of FIG. 9, here shown as a dark line. The small pulses, e.g., the small pulses 574, 576, can be indicative of a self-test that is passing.

The graph 580 includes yet another exemplary combined output signal 582, which can be the same as or similar to the combined output signal 256a, 256a' of FIGS. 5, 5A, and 6, and the combined output signal 54a of FIG. 1. The combined output signal 582 can include pulses, e.g., pulses 584, 586, combined with the sensor non-linear output signal 532 of FIG. 9, here shown as a dark line. The pulses, e.g., the pulses 584, 586, can be indicative of a self-test that is passing.

The graph 590 includes yet another exemplary combined output signal 592, which can be the same as or similar to the combined output signal 256a, 256a' of FIGS. 5, 5A, and 6, and the combined output signal 54a of FIG. 1. The combined output signal 592 can include small pulses, e.g., pulses 594, 596, combined with the sensor linear output signal 538 of FIG. 9, here shown as a dark line. The pulses, e.g., the pulses 594, 596, can be indicative of a self-test that is passing. Digitally encoded versions of all of the above output signals are also possible.

Referring now to FIGS. 10-10B, graphs 600, 610, and 620 have vertical axes with scales in arbitrary units of volts and horizontal axes with scales in arbitrary units of time.

Figure 8A:
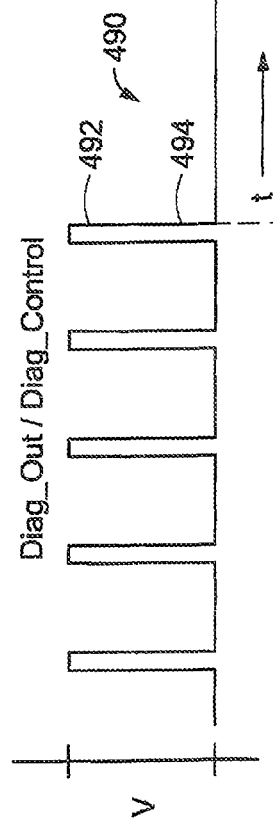
Figure 8B:
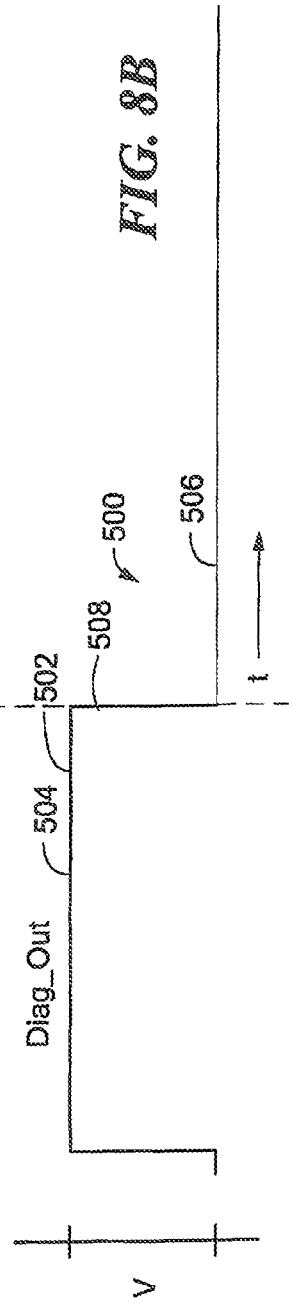

The graph 600, like the graph 420 of FIG. 7A and the graph 490 of FIG. 8A, includes an exemplary diagnostic control signal 602, which can be the same as or similar to the diagnostic control signal 260a of FIGS. 5, 5A, and 6, and the diagnostic control signal 198a of FIG. 4. The graph 600 can also be representative of a diagnostic output signal, which can be the same as or similar to the diagnostic output signal 254a, 254a' of FIGS. 5, 5A, and 6. It should be understood that the graph 600 can also be representative of current pulses in the self-test current signal 218 of FIGS. 5, 5A, and 6.

The signal 602 can include pulses, of which a pulse 604 is but one example. While the signal 602 is shown to include five pulses, other such signals 422 can include more than five or fewer than five pulses.

The graph 610 includes a sensor non-linear comparison signal 612, which can be the same as or similar to the sensor non-linear comparison signal 240a' of FIG. 5A. The sensor non-linear comparison signal 612 includes high states, for example, high states 614a, 614b, and low states, for example, a low state 616.

The graph 620 includes an exemplary sensor non-linear output signal 622, which can be the same as or similar to the sensor non-linear output signal 244a' of FIG. 5A. The sensor non-linear output signal 622 is representative of the function of the logic circuit 306 of FIG. 5A. The sensor non-linear output signal 622 can include pulses, e.g., pulses 624, 626, combined with the sensor non-linear comparison signal 612 of FIG. 10A, here shown as a dark line. The pulses, e.g., the pulses 624, 626, can be indicative of a self-test that is passing, namely, a properly functioning comparator 240 and SOFC 244 of FIG. 5A.

Figure 11:
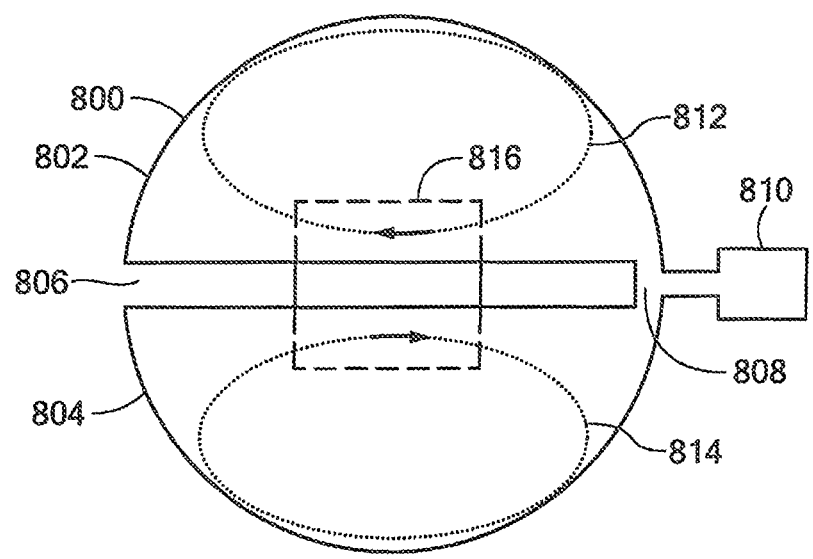
FIG. 11 is a top view of an exemplary electromagnetic shield that can form part of the magnetic field sensor of FIG. 1, and which can be used as the electromagnetic shield of FIGS. 3, 3A, 3C, and 3D.

Referring now to FIG. 11, an exemplary electromagnetic shield 800 can be the same as or similar to the electromagnetic shield 72 of FIG. 3. The electromagnetic shield 800 is placed generally over a magnetic field sensing element 816, which can be the same as or similar to the magnetic field sensing element 92 of FIG. 3. The electromagnetic shield 800 includes a first portion 802 and a second portion 804 separated by a slit 806. The first portion 802 and the second portion 804 are coupled with a conductive region 808. A bonding pad 810 allows the electromagnetic shield 800 to be coupled to a DC voltage, for example, to a ground voltage.

The electromagnetic shield 800 can be formed from a metal layer during manufacture of a magnetic field sensor, for example, the magnetic field sensor 70 of FIG. 3. The metal layer can be comprised of a variety of materials, for example, aluminum, copper, gold, titanium, tungsten, chromium, or nickel.

It should be understood that an electromagnetic shield is not the same as a magnetic shield. An electromagnetic shield is intended to block electromagnetic fields. A magnetic shield is intended to block magnetic fields.

In the presence of an AC magnetic field (e.g., a magnetic field surrounding a current carrying conductor), it will be understood that AC eddy currents 812, 814 can be induced in the electromagnetic shield 800. The eddy currents 812, 814 form into closed loops as shown. The closed loop eddy currents 812, 814 tend to result in a smaller magnetic field in proximity to the electromagnetic shield 800 than the magnetic field that induced the eddy currents 812, 814. Therefore, if the electromagnetic shield 800 were placed near a magnetic field sensing element, for example, the magnetic field sensing element 92 of FIG. 3, the magnetic field sensing element 92 experiences a smaller magnetic field than it would otherwise experience, resulting in a less sensitive magnetic field sensor, which is generally undesirable. Furthermore, if the magnetic field associated with the eddy current is not uniform or symmetrical about the magnetic field sensing element 92, the magnetic field sensing element 92 might also generate an undesirable offset voltage.

The slit 806 tends to reduce a size (i.e., a diameter or path length) of the closed loops in which the eddy currents 812, 814 travel. It will be understood that the reduced size of the closed loops in which the eddy currents 812, 814 travel results in smaller eddy currents 812, 814 and a smaller local effect on the AC magnetic field that induced the eddy current. Therefore, the sensitivity of a magnetic field sensor on which the magnetic field sensing element 816 and the electromagnetic shield 800 are used is less affected by the smaller eddy currents.

Furthermore, by placing the shield 800 in relation to the magnetic field sensing element 816 as shown, so that the slit 806 passes over the magnetic field sensing element 816, it will be understood that the magnetic field associated with any one of the eddy currents 812, 814 tends to form magnetic fields passing through the magnetic field sensing element 816 in two directions, canceling over at least a portion of the area of the magnetic field sensing element 816.

Figure 12:
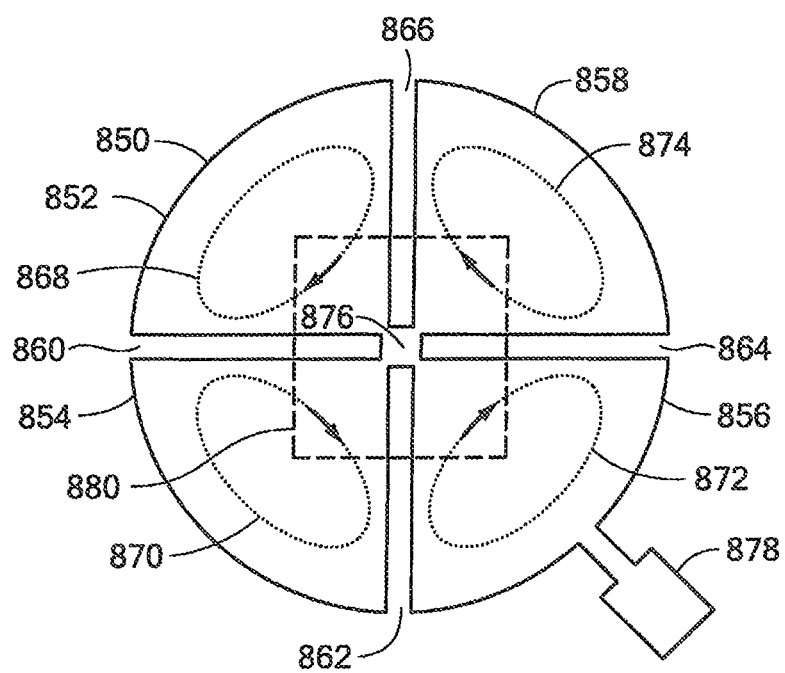
FIG. 12 is a top view of another exemplary electromagnetic shield that can form part of the magnetic field sensor of FIG. 1, and which can be used as the electromagnetic shield of FIGS. 3, 3A, 3C, and 3D.

Referring now to FIG. 12, another exemplary electromagnetic shield 850 can be the same as or similar to the electromagnetic shield 72 of FIG. 3. The electromagnetic shield 850 includes four portions 852-858 separated by four slits 860-866. The four portions 852-858 are coupled with a conductive region 876. A bonding pad 878, allows the electromagnetic shield 850 to be coupled to a DC voltage, for example, a ground voltage.

In the presence of a magnetic field, it will be understood that eddy currents 868-874 can be induced in the electromagnetic shield 850. Due to the four slits 860-866, it will be understood that a size (i.e., a diameter or a path length) of the closed loops eddy currents 866-874 tends to be smaller than the size of the closed loop eddy currents 812, 814 of FIG. 11. It will be understood that the reduced size of the closed loops in which the eddy currents 868-874 travel results in smaller eddy currents 868-874 and a smaller local affect on the AC magnetic field that induced the eddy current than that which results from the shield 800 of FIG. 11. Therefore, the sensitivity of a magnetic field sensor on which the magnetic field sensing element 880 and the electromagnetic shield 850 are used is less affected by the smaller eddy currents 868-874 than the sensitivity of a current sensor using the shield 800 of FIG. 11.

Furthermore, by placing the shield 850 in relation to the magnetic field sensing element 880 as shown, so that the slits 860-866 pass over the magnetic field sensing element 880, it will be understood that the magnetic field associated with any one of the eddy currents 868-874, tends to form magnetic fields passing through the magnetic field sensing element 880 in two directions, canceling over at least a portion of the area of the magnetic field sensing element 880.

Figure 13:
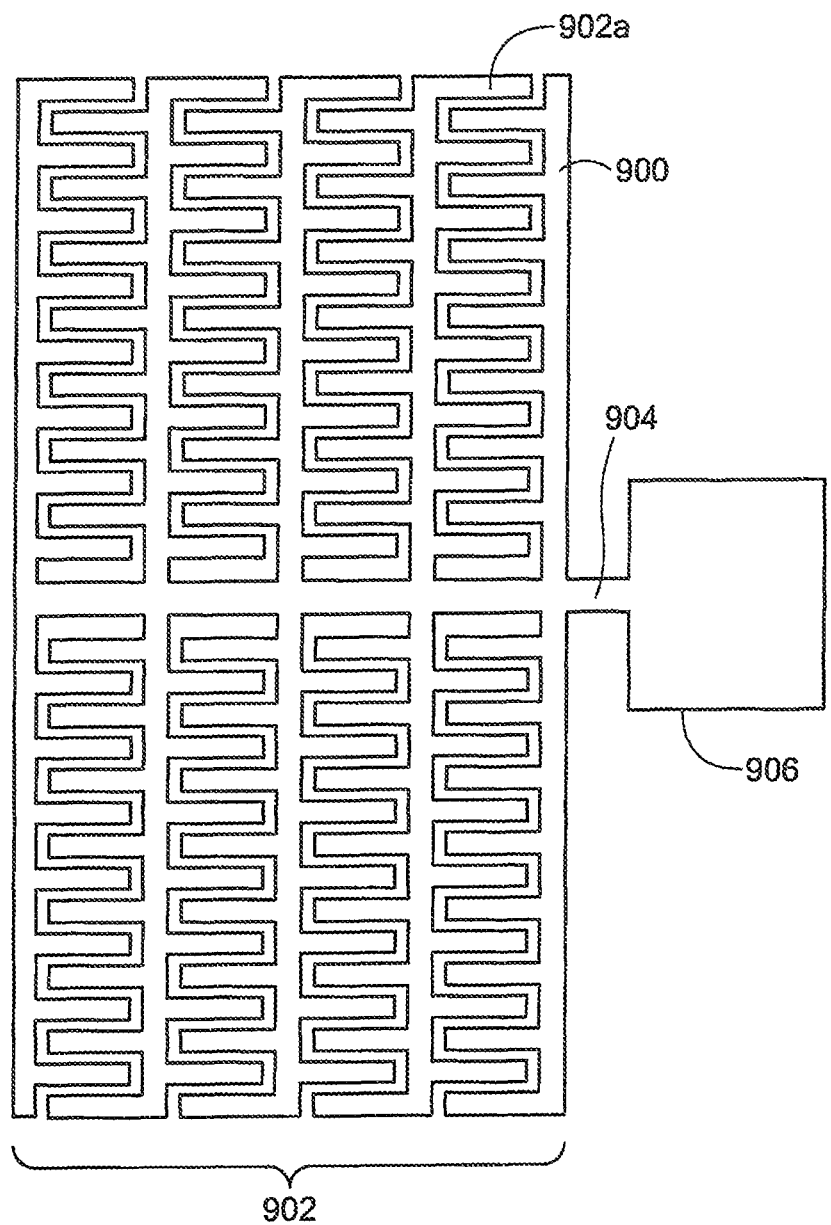
FIG. 13 is a top view of yet another exemplary electromagnetic shield that can form part of the magnetic field sensor of FIG. 1, and which can be used as the electromagnetic shield of FIGS. 3, 3A, 3C, and 3D.

Referring now to FIG. 13, another exemplary electromagnetic shield 900 can be the same as or similar to the electromagnetic shield 72 of FIG. 3. The electromagnetic shield 900 includes a shielding portion 902 having interdigitated members, of which member 902a is but one example. The interdigitated members are coupled though a conductor portion 904 to a bonding pad 906, which allows the electromagnetic shield 900 to be coupled to a DC voltage, for example, a ground voltage.

It will be recognized that the electromagnetic shield 900 is able to support eddy currents having a much smaller size (i.e., diameter of path length) than the electromagnetic shield 850 of FIG. 12 or the electromagnetic shield 800 of FIG. 11. Therefore, the electromagnetic shield 900 tends to have an even smaller negative affect on sensitivity of a magnetic field sensor than that described above.

Figure 14:
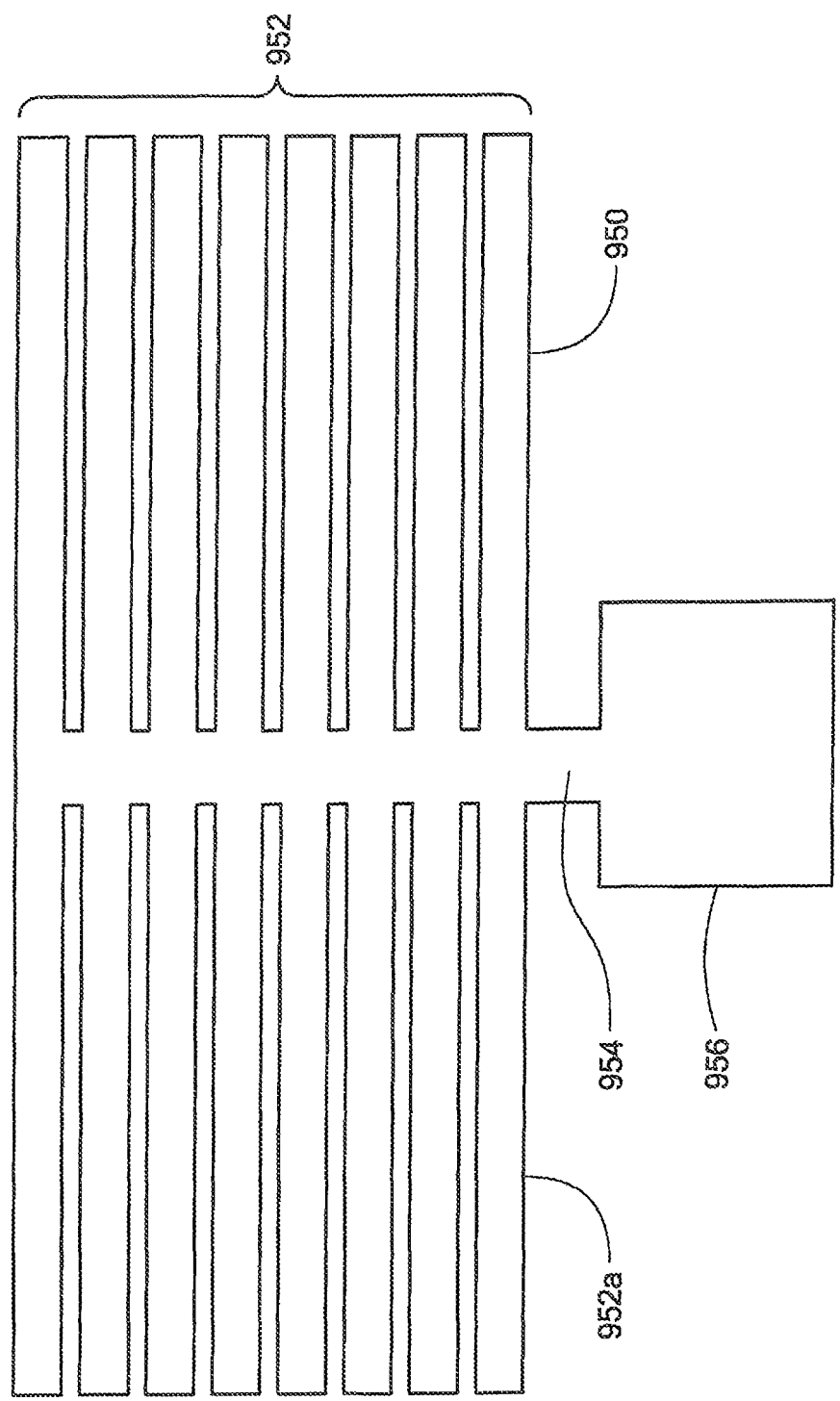
FIG. 14 is a top view of yet another exemplary electromagnetic shield that can form part of the magnetic field sensor of FIG. 1, and which can be used as the electromagnetic shield of FIGS. 3, 3A, 3C, and 3D.

Referring now to FIG. 14, an electromagnetic shield 950 can be the same as or similar to the electromagnetic shield 72 of FIG. 3. The electromagnetic shield 950 includes a shielding portion 952 having a plurality of members, of which member 952a is but one example. The members are coupled though a conductor portion 954 to a bonding pad 956, which allows the electromagnetic shield 950 to be coupled to a DC voltage, for example, a ground voltage. Advantages of the electromagnetic shield 950 will be apparent from discussion above.

While shields having features to reduce eddy currents are described above, the shield 72 of FIGS. 3, 3A, 3C, and 3D can also have no features to reduce eddy currents.

Figure 15:
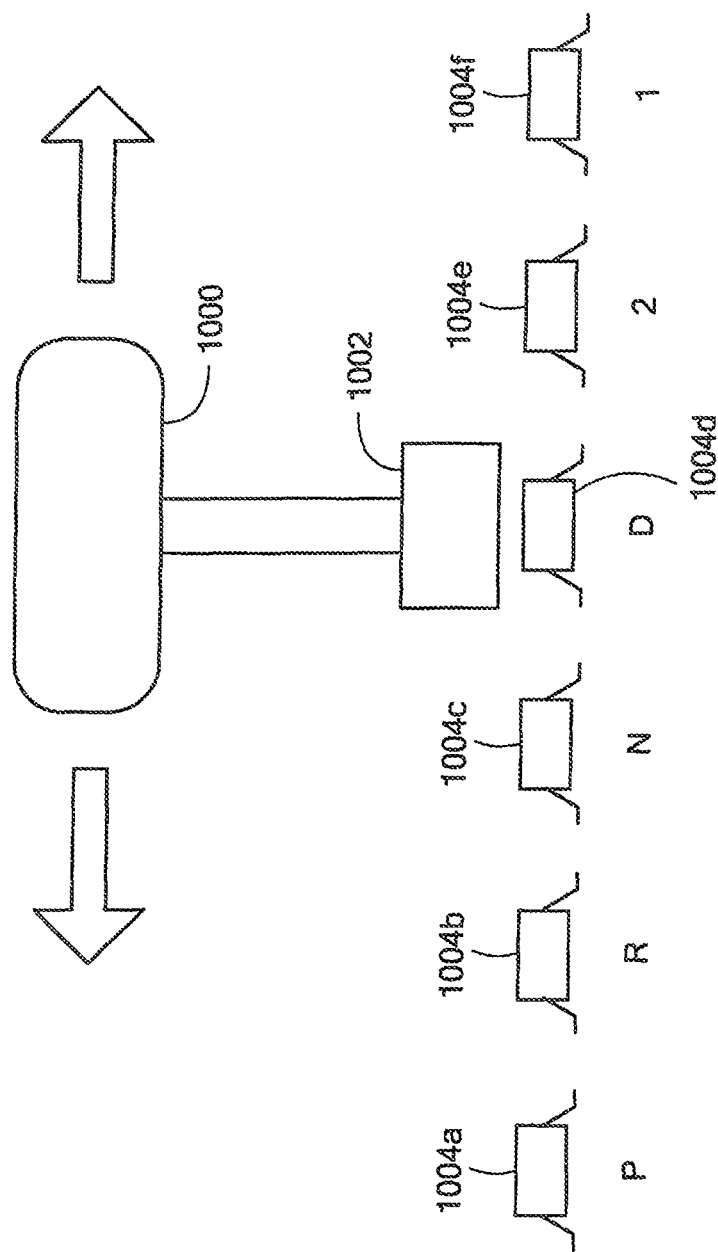
FIG. 15 is a block diagram showing a plurality of magnetic field sensors used to sense a position of a gear shift lever as may be provided in an automobile.

Referring now to FIG. 15, an exemplary application of the above-described magnetic field sensors includes five magnetic field sensors 1004a-1004f arranged in a line. A gear shift lever 1000, such as that which may be found in an automobile, can move left or right in the view shown to select a gear, which may, for example, be park (P), reverse (R), neutral (N), drive (D), second gear (2), or first gear (1). Each gear is associated with a respective one of the magnetic field sensors as shown.

The gearshift lever 1000 can have a magnet 1002 disposed on an end thereof nearest to the magnetic field sensors 1004a-1004f. In operation, a magnetic field sensor, e.g., the magnetic field sensor 1004d, senses when the gearshift lever 1000 is at a position of the particular magnetic field sensor, e.g., 1004d, and thus, senses the particular gear associated with the position of the gear shift lever. In this way, the magnetic field sensors 1004a-1004f can provide respective signals to a computer processor or the like, which can electronically/mechanically configure the automobile transmission into the selected gear.

This particular arrangement is shown to point out a potential problem with the arrangements of FIGS. 5, 5A, and 6. In particular, if the magnetic field generated by the magnet 1002 is in the same direction as the magnetic field generated by the self-test conductor 224 of FIGS. 5, 5A, and 6, then the magnetic field generated by the self-test conductor 224 may be overwhelmed by the magnetic field generated by the magnet, resulting in no diagnostic output signal 254a, 254a' (FIGS. 5, 5A, 6).

In some embodiments, this shortcoming can be overcome merely by selecting the magnetic field generated by the magnet 1002 to be in a direction opposite to the direction of the magnetic field generated by the self-test conductor 224. However, in other embodiments, it may be desirable to have a magnetic field sensor that can select and/or change a direction of the magnetic field generated by the self-test conductor 224. An exemplary arrangement having this ability is shown in FIG. 16.

Figure 16:
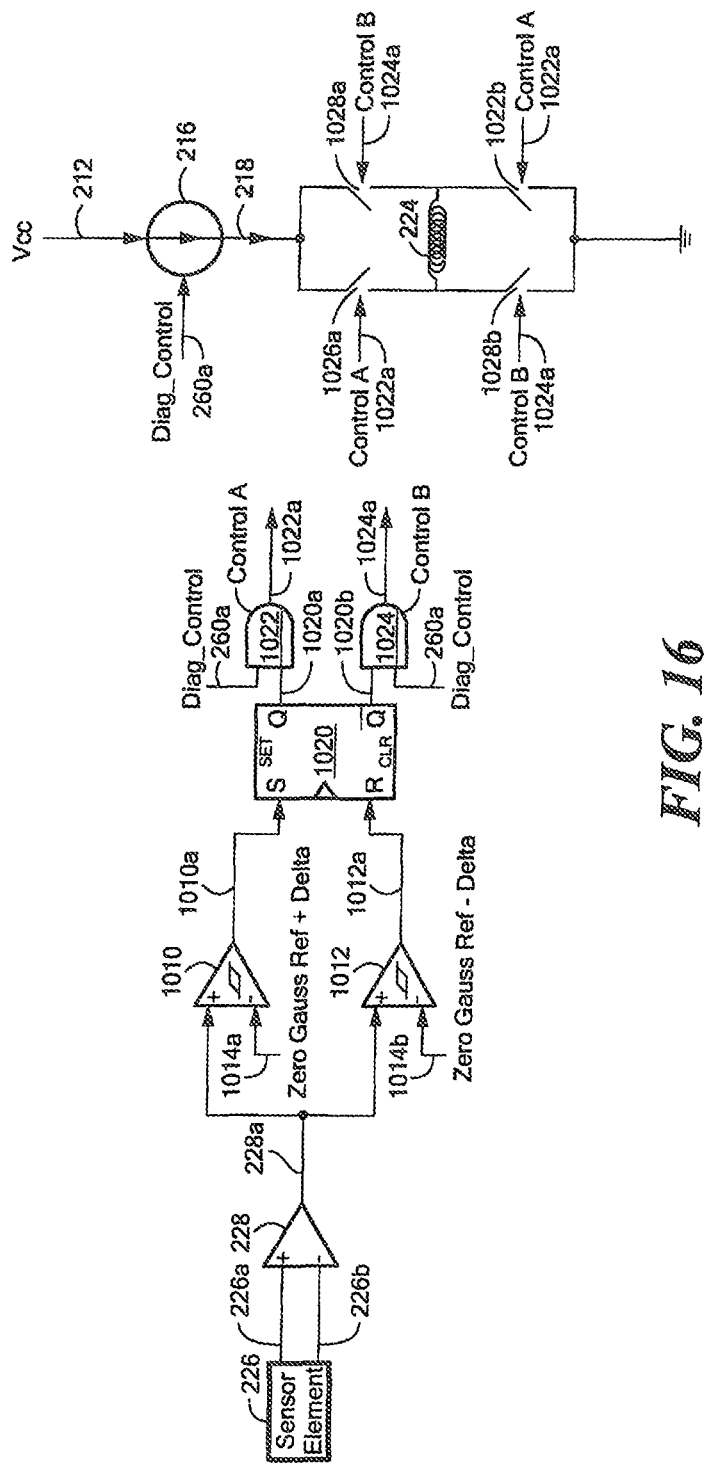
FIG. 16 is a block diagram of a circuit having a self-test conductor, through which a direction of a drive current can be changed.

Referring now to FIG. 16, in which like elements of FIGS. 5, 5A, and 6 are shown having like reference designations, a circuit includes the self-test conductor 224, but arranged in a different way than is shown in other figures. Though shown separately spaced in FIG. 16, it should be understood that, like the embodiments of FIGS. 5, 5A, and 6, the magnetic field sensing element 226 can be proximate to the self-test conductor 224.

Two comparators 1010, 1012 can be coupled to receive the signal 228a from the amplifier 228. The comparator 1010 can also be coupled to receive a comparison signal 1014a representative of a signal from the amplifier 228 when the magnetic field sensing element experiences zero Gauss (or a background magnetic field, e.g., the earth's magnetic field) plus a delta. The comparator 1012 can also be coupled to receive a comparison signal 1014b representative of a signal from the amplifier 228 when the magnetic field sensing element experiences zero Gauss (or a background magnetic field, e.g., the earth's magnetic field) minus a delta.

The comparator 1010 can generate a first comparison signal 1010a, and the comparator 1012 can generate a second comparison signal 1012a.

A flip-flop (i.e., a latch) 1020 can be coupled to receive the first and second comparison signals 1010a, 1012a, respectively at set and reset inputs and can be configured to generate a first output signal 1020a and a second output signal 1020b.

A first logic gate, for example, an AND gate 1022, can be coupled to receive the first output signal 1020a, coupled to receive the diagnostic control signal 260a (FIGS. 5, 5A, 6), and configured to generate a control signal 1022a (Control A).

A second logic gate, for example, an AND gate 1024, can be coupled to receive the second output signal 1020b, coupled to receive the diagnostic control signal 260a, and configured to generate a control signal 1024a (Control B).

The self-test conductor 224 can be arranged in the cross arm of an H-bridge surrounded by switches 1026a, 1026b, 1028a, 1028b. The switches 1026a, 1026b are controlled by the first control signal 1022a, and the switches 1028a, 1028b are controlled by the second control signal 1024a.

Thus, in operation, when the current generator 216 generates the current 218 in response to the diagnostic control signal 260a, the current 218 flows through the self-test conductor 224 in one of two directions determined by the first and second control signals 1022a, 1024a.

The comparators 1010, 1012 and the flip flop 1020 operate essentially as a window comparator, so that when the magnetic field experienced by the magnetic field sensing element 226 is large in a first direction, the diagnostic current passing through the self-test conductor 224 generates a magnetic field in an opposite second direction (when the diagnostic control signal 260a is also high). Conversely, when the magnetic field experienced by the magnetic field sensing element 226 is large in the second direction, the diagnostic current passing through the self-test conductor 224 is in the opposite first direction (when the diagnostic control signal 260a is also high).

With this arrangement, even in the presence of a fairly large magnetic field in either direction, which tends to saturate the magnetic field sensing element 226, or electronics coupled to the magnetic field sensing element, for example, the amplifier 228, still the self-test signal 218 can generate a magnetic field in the opposite direction, which can propagate to the diagnostic output signal 254, 254a' of FIGS. 5, 5A, and 6.

It will be apparent that the circuit of FIG. 16 can be incorporated into the circuits of preceding figures.

All references cited herein are hereby incorporated herein by reference in their entirety. Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A magnetic field sensor comprising:
   a magnetic field sensing element supported by a substrate, wherein the magnetic field sensing element is configured to generate a self-test signal responsive to a pulsing self-test magnetic field during one or more self-test time periods;
   a self-test circuit supported by the substrate, the self-test circuit comprising:
      a self test current conductor proximate to the magnetic field sensing element, the self-test current conductor for carrying a self-test current to generate the self-test magnetic field;
      a processing circuit coupled to receive a signal representative of the self-test signal; and a diagnostic request processor configured to control the self-test current to be on or off in response to a diagnostic input signal received by the diagnostic request processor or to be indicative of a self-test during one or more time periods in response to a control signal generated by the diagnostic request processor.

2. The magnetic field sensor of claim 1, wherein the diagnostic request processor comprises a decoder coupled to receive the diagnostic input signal, configured to decode the diagnostic input signal, and configured to generate a diagnostic control signal to control the self-test current.

3. The magnetic field sensor of claim 1, wherein the diagnostic request processor comprises an internal diagnostic clock generator configured to generate the diagnostic control signal to control the self-test current to comprise a group of current pulses during the one or more time periods.

4. The magnetic field sensor of claim 1, wherein the self-test circuit further comprises:
a current generator circuit having an output node at which self-test current pulses are generated, wherein the self-test current conductor is coupled to receive the self-test current pulses resulting in the self-test magnetic field having magnetic field pulses.

5. The magnetic field sensor of claim 4, wherein the current generator is configured to generate the self-test current pulses in response to the diagnostic control signal.

6. The magnetic field sensor of claim 4, wherein the diagnostic input signal comprises control pulses, each control pulse resulting in one self-test current pulse from the current generator.

7. The magnetic field sensor of claim 4, wherein the diagnostic input signal comprises control pulses, each control pulse resulting in a plurality of self-test current pulses from the current generator.

8. The magnetic field sensor of claim 4, wherein the diagnostic input signal comprises a first state during which the current generator generates self-test current pulses and a second state during which the current generator does not generate self-test current pulses.

9. The magnetic field sensor of claim 4, wherein the diagnostic input signal comprises first control pulses with a first duty cycle during Which the current generator generates self-test current pulses, and wherein the diagnostic input signal comprises second control pulses with a second duty cycle during which the current generator does not generate self-test current pulses.

10. The magnetic field sensor of claim 4 wherein the diagnostic input signal comprises a binary digital word.

11. The magnetic field sensor of claim 1, wherein the self-test current conductor comprises a conductor supported by the substrate and proximate to the magnetic field sensing element.

12. The magnetic field sensor of claim 1, wherein the self-test current conductor comprises a conductor supported by the substrate and spanning more than one metal layer supported by the substrate.

13. The magnetic field sensor of claim 1, further comprising an electromagnetic shield proximate to the magnetic field sensor.

14. The magnetic field sensor of claim 13, wherein the electromagnetic shield comprises at least one feature configured to reduce an eddy current in the electromagnetic shield when the shield is exposed to an AC magnetic field.

15. The magnetic field sensor of claim 1, wherein the magnetic field sensing element comprises a Hall effect element, wherein the magnetic field sensor further comprises a current or voltage generator coupled to the Hall effect element.

16. The magnetic field sensor of claim 1, wherein the magnetic field sensing element comprises a magnetoresistance element, wherein the magnetic field sensor further comprises a current generator coupled to the magnetoresistance element.

17. The magnetic field sensor of claim 1, wherein the one or more self-test time periods comprises a time period beginning with a power-on of the magnetic field sensor and terminating a predetermined time thereafter.

18. A method of generating a self-test of a magnetic field sensor, comprising:
generating, with a magnetic field sensing element supported, by a substrate, a self-test signal responsive to a pulsing self-test magnetic field during one or more self-test time periods;
providing a self-test circuit supported by the substrate, the providing the self-test circuit comprising:
providing a self-test current conductor proximate to the magnetic field sensing element, the self-test current conductor for carrying a self-test current to generate the self-test magnetic field;
providing a processing circuit coupled to receive a signal representative of the self-test signal; and
providing a diagnostic request processor configured to control the self-test current to be on or off in response to a diagnostic input signal received by the diagnostic request processor or to be indicative of a self-test during one or more time periods in response to a control signal generated by the diagnostic request processor.

19. The method of claim 18, further comprising:
controlling, in response to an internal control signal, the self-test current to comprise a group of current pulses during the one or more time periods.

20. The method of claim 18, wherein the self-test current conductor comprises a conductor supported by the substrate and proximate to the magnetic field sensing element.

21. The method of claim 18, wherein the self-test current conductor comprises a coil supported by the substrate and spanning more than one metal layer supported by the substrate.

22. The method of claim 21, further comprising electromagnetically shielding the magnetic field sensor.

23. The method of claim 18, further comprising electromagnetically shielding the magnetic field sensor.

24. The method of claim 18, wherein the one or more self-test time periods comprises a time period beginning with a power-on of the magnetic field sensor and terminating a predetermined time thereafter.

* * * * *

UNITED STATES PATENT AND TRADEMARK OFFICE
CERTIFICATE OF CORRECTION

PATENT NO. : 9,151,807 B2
APPLICATION NO. : 14/321347
DATED : October 6, 2015
INVENTOR(S) : Andreas P. Friedrich et al.

It is certified that error appears in the above-identified patent and that said Letters Patent is hereby corrected as shown below:

Specification

Column 1, line 27 delete "to a magnetic field" and replace with --to magnetic field--.

Column 3, line 19 delete "FIG. 1 is block" and replace with --FIG. 1 is a block--.

Column 3, line 39 delete "FIG. 3 is block" and replace with --FIG. 3 is a block--.

Column 3, line 45 delete "FIG. 3A is block" and replace with --FIG. 3A is a block--.

Column 3, line 49 delete "FIG. 3B is block" and replace with --FIG. 3B is a block--.

Column 3, line 53 delete "FIG. 3C is block" and replace with --FIG. 3C is a block--.

Column 3, line 59 delete "FIG. 3D is block" and replace with --FIG. 3D is a block--.

Column 4, line 41 delete "a series of graph" and replace with --a series of graphs--.

Column 6, line 16 delete "let is suffice" and replace with --let it suffice--.

Column 6, line 51 delete "that that" and replace with --that--.

Column 9, line 9 delete "conductor 30'''''''" and replace with --conductor 30''''''--.

Column 9, line 13 delete "conductor 30'''''''" and replace with --conductor 30''''''--.

Column 10, line 6 delete "of FIGS. 3" and replace with --of FIG. 3--.

Column 10, line 51 delete "30, 18 or FIG. 1" and replace with --30, 18 of FIG. 1--.

Signed and Sealed this
Fourteenth Day of June, 2016

Michelle K. Lee
*Director of the United States Patent and Trademark Office*

CERTIFICATE OF CORRECTION (continued)
U.S. Pat. No. 9,151,807 B2

Specification

Column 13, line 58 delete "processor 58 or" and replace with --processor 58 of--.

Column 16, line 4 delete "pass though to" and replace with --pass through to--.

Column 22, line 26 delete "currents 866-874" and replace with --currents 868-874--.

Column 22, line 51 delete "coupled though a" and replace with --coupled through a--.

Column 22, line 67 delete "though a" and replace with --through a--.

Claims

Column 26, line 21-22 delete "element supported. by" and replace with --element supported by--.